(12) United States Patent
Sugiyama et al.

(10) Patent No.: US 8,790,999 B2
(45) Date of Patent: Jul. 29, 2014

(54) METHOD FOR MANUFACTURING NITRIDE SEMICONDUCTOR CRYSTAL LAYER

(71) Applicant: Kabushiki Kaisha Toshiba, Minato-ku (JP)

(72) Inventors: Naoharu Sugiyama, Kanagawa-ken (JP); Tomonari Shioda, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/775,794

(22) Filed: Feb. 25, 2013

(65) Prior Publication Data

US 2013/0196487 A1 Aug. 1, 2013

Related U.S. Application Data

(62) Division of application No. 13/037,582, filed on Mar. 1, 2011, now Pat. No. 8,476,151.

(30) Foreign Application Priority Data

Sep. 7, 2010 (JP) ................................. 2010-200086
Feb. 25, 2011 (JP) ................................. 2011-039407

(51) Int. Cl.
*H01L 21/36* (2006.01)
*H01L 21/02* (2006.01)
*H01L 29/20* (2006.01)

(52) U.S. Cl.
CPC .... *H01L 21/02381* (2013.01); *H01L 21/02458* (2013.01); *H01L 21/0254* (2013.01); *H01L 29/2003* (2013.01)
USPC .......................................... 438/479; 438/480

(58) Field of Classification Search
CPC ................... H01L 21/02381; H01L 21/02458; H01L 21/0254; H01L 29/2003
USPC .................................................. 438/479, 480
See application file for complete search history.

(56) References Cited

U.S. PATENT DOCUMENTS 4,845,044 A 7/1989 Ariyoshi et al.
2006/0249748 A1 11/2006 Piner et al.

FOREIGN PATENT DOCUMENTS

CN 101302648 11/2008
(Continued)

OTHER PUBLICATIONS

S. Zamir, et al., "Reduction of cracks in GaN films grown on Si-on-insulator by lateral confined epitaxy", Journal of Crystal Growth, vol. 243, 2002, pp. 375-380.
Extended European Search Report issued May 4, 2011 in Application No. / Patent No. 11156399.5-2203.

(Continued)

*Primary Examiner* — Alexander Ghyka
(74) *Attorney, Agent, or Firm* — Oblon, Spivak, McClelland, Maier & Neustadt, L.L.P.

(57) ABSTRACT

According to one embodiment, a method is disclosed for manufacturing a nitride semiconductor crystal layer. The method can include forming the nitride semiconductor crystal layer having a first thickness on a silicon crystal layer. The silicon crystal layer is provided on a base body. The silicon crystal layer has a second thickness before the forming the nitride semiconductor crystal layer. The second thickness is thinner than the first thickness. The forming the nitride semiconductor crystal layer includes making at least a portion of the silicon crystal layer incorporated into the nitride semiconductor crystal layer to reduce a thickness of the silicon crystal layer from the second thickness.

18 Claims, 17 Drawing Sheets

(56) References Cited

FOREIGN PATENT DOCUMENTS

| | | |
|---|---|---|
| JP | 7-245266 | 9/1995 |
| JP | 10-135140 | 5/1998 |
| JP | 10-287497 | 10/1998 |
| JP | 10-321535 | 12/1998 |
| JP | 2003-37287 | 2/2003 |
| JP | 2003-257879 | 9/2003 |
| JP | 2008-182110 | 8/2008 |
| JP | 2010-509081 | 3/2010 |
| JP | 2011-501431 | 1/2011 |
| JP | 2011-101007 | 5/2011 |
| WO | WO 2005/088687 A1 | 9/2005 |

OTHER PUBLICATIONS

D. Zubia, et al., "Nanoheteroepitaxial growth of GaN on Si by organometallic vapor phase epitaxy", Applied Physics Letters, vol. 76, No. 7, XP 012025868, Feb. 14, 2000, pp. 858-860.

Y. Fujikawa, et al. "Silicon on insulator for symmetry-converted growth", Applied Physics Letters, vol. 90, No. 24, XP012095299, Jun. 12, 2007, pp. 243107-1-243107-3.

Japanese Office Action issued Dec. 5, 2011 in Patent Application No. 2011-039407 (with English-language translation).

Combined Taiwanese Office Action and Search Report issued Nov. 21, 2013 in Patent Application No. 100106735 (with English language translation).

Combined Chinese Office Action and Search Report issued Dec. 3, 2013 in Patent Application No. 201110049525.0 (with English language translation).

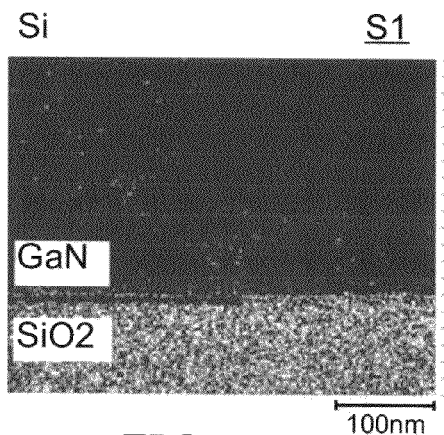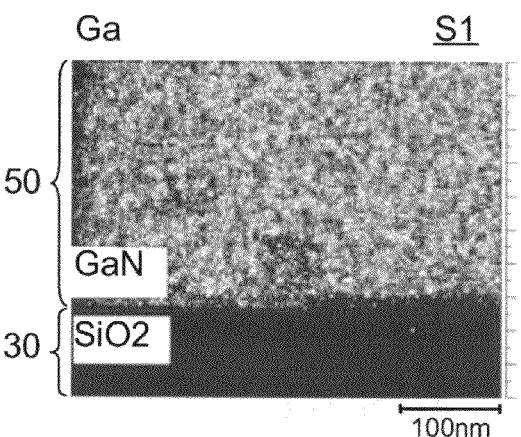
FIG. 16A  FIG. 16B
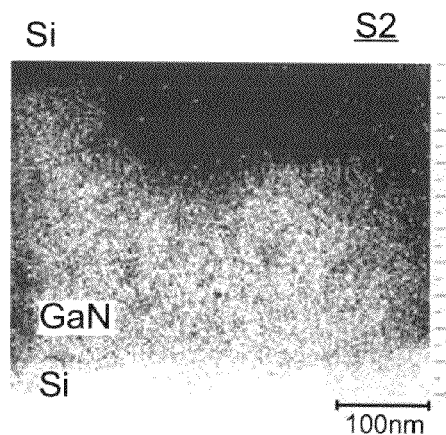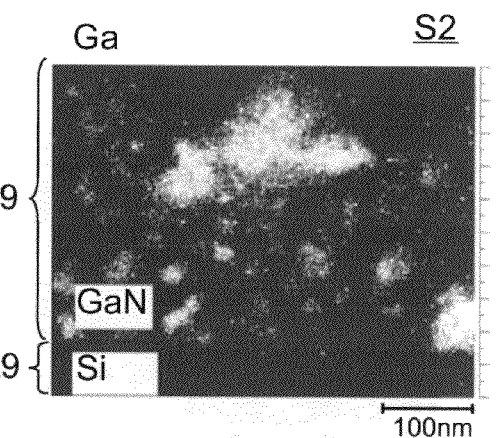
FIG. 16C  FIG. 16D

METHOD FOR MANUFACTURING NITRIDE SEMICONDUCTOR CRYSTAL LAYER

CROSS-REFERENCE TO RELATED APPLICATIONS

This application is a division of and claims the benefit of priority under 35 U.S.C. §120 from U.S. Ser. No. 13/037,582 filed Mar. 1, 2011, and claims the benefit of priority under 35 U.S.C. §119 from Japanese Patent Application No. 2010-200086 filed Sep. 7, 2010 and Japanese Patent Application No. 2011-039407 filed Feb. 25, 2011, the entire contents of each of which are incorporated herein by reference.

FIELD

Embodiments described herein relate generally to a method for manufacturing a nitride semiconductor crystal layer.

BACKGROUND

Compound semiconductors are used in various fields such as high-speed electron devices exemplified by high frequency devices, optical devices exemplified by light emitting and light receiving devices, and the like. High-performance devices are in practical use. In order to fabricate high-quality devices, it is generally necessary to prepare a high-quality substrate crystal. However, crystal substrates of compound semiconductors have small diameters, (if it is) compared with silicon substrate which have large diameter. And then, processes for fabricating semiconductors using such substrates are prone to having poor mass-productivity.

BRIEF DESCRIPTION OF THE DRAWINGS

FIGS. 16A to 16D are images showing analysis results that illustrate the characteristics of the nitride semiconductor crystal layer;

DETAILED DESCRIPTION

In general, according to one embodiment, a method is disclosed for manufacturing a nitride semiconductor crystal layer. The method can include forming the nitride semiconductor crystal layer having a first thickness on a silicon crystal layer. The silicon crystal layer is provided on a base body. The silicon crystal layer has a second thickness before the forming the nitride semiconductor crystal layer. The second thickness is thinner than the first thickness. The forming the nitride semiconductor crystal layer includes making at least a portion of the silicon crystal layer incorporated into the nitride semiconductor crystal layer to reduce a thickness of the silicon crystal layer from the second thickness.

For example, the method for manufacturing a nitride semiconductor crystal layer according to the embodiment is a method for manufacturing a nitride semiconductor crystal layer that includes stacking the nitride semiconductor crystal layer on a structure in which a silicon crystal layer is stacked on a base body. The nitride semiconductor crystal layer has a thickness thicker than the thickness of the silicon crystal layer. The manufacturing method reduces the thickness of the silicon crystal layer by making a portion or an entirety of the silicon crystal layer incorporated into the nitride semiconductor crystal layer.

For example, the method for manufacturing a nitride semiconductor crystal layer according to the embodiment is a method for manufacturing a nitride semiconductor crystal layer that includes stacking the nitride semiconductor crystal layer on a crystal layer formed on an intermediate layer stacked on a base body. The manufacturing method reduces the thickness of the crystal layer by making a portion or an entirety of the crystal layer incorporated into the nitride semiconductor crystal layer.

Embodiments will be described hereinafter with reference to the drawings.

First Embodiment

Figure 1:
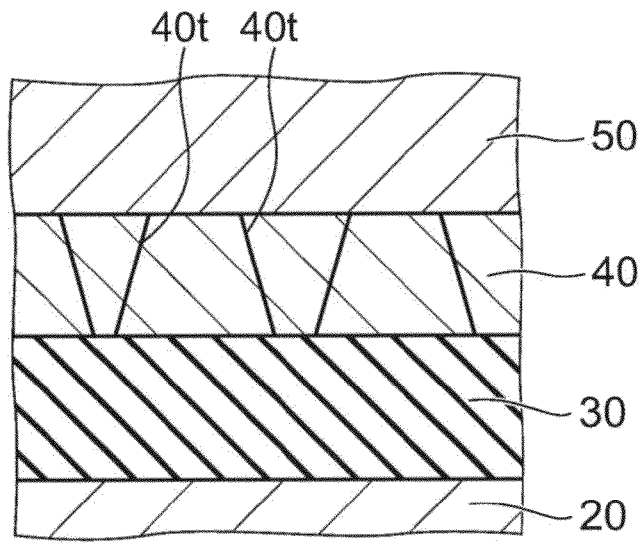
FIG. 1 is a schematic cross-sectional view illustrating a method for manufacturing a nitride semiconductor crystal layer according to a first embodiment.

FIG. 1 is a schematic cross-sectional view illustrating a method for manufacturing a nitride semiconductor crystal layer according to a first embodiment.

Figure 2:
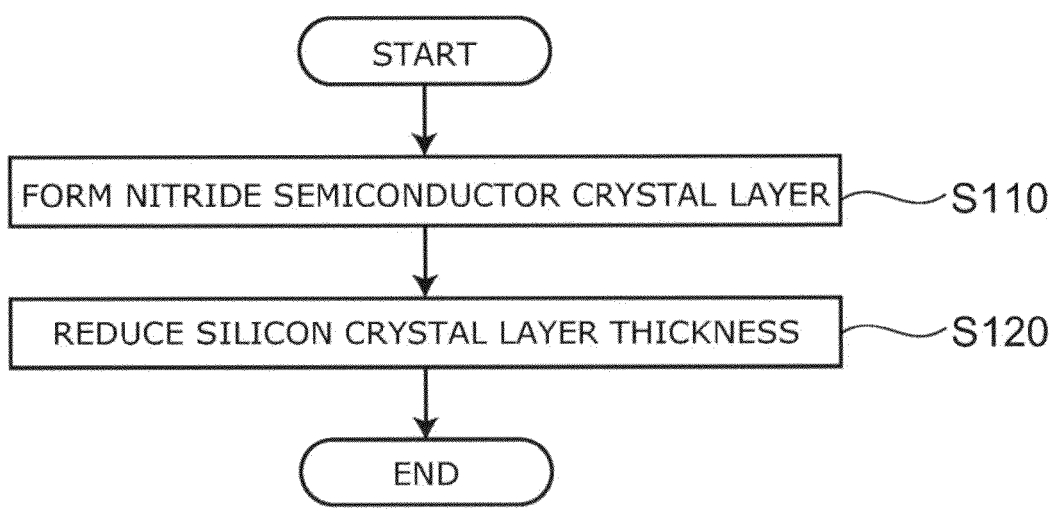
FIG. 2 is a flowchart illustrating the method for manufacturing a nitride semiconductor crystal layer according to the first embodiment.

FIG. 2 is a flowchart illustrating a method for manufacturing a nitride semiconductor crystal layer according to the first embodiment.

This embodiment is a method for manufacturing a nitride semiconductor crystal layer including: preparing a structure in which a silicon crystal layer 40 having a thickness of 50 nm or less is stacked on a base body 20, and stacking a nitride semiconductor crystal layer 50 having a greater thickness than the silicon crystal layer 40 on the structure.

In this embodiment, the nitride semiconductor crystal layer 50 is formed on the structure in which the silicon crystal layer is stacked on the base body 20 (step S110). After or in this forming of the nitride semiconductor crystal layer 50, a thickness of the silicon crystal layer 40 is reduced (step S120) by a portion or an entirety of the silicon crystal layer 40 reacting with the nitride semiconductor crystal layer 50. An interdiffusion of gallium atoms and silicon atoms occurs and the silicon atoms are incorporated into the nitride semiconductor crystal.

In this embodiment, a structure is provided in which the nitride semiconductor crystal layer 50 is stacked on the base body 20 via the silicon crystal layer 40, which is ultrathin and has its lattice extending in an in-plane direction. An intermediate layer 30 having low reactivity with group III metal atoms (group 3 metal atoms) may be provided between the base body 20 and the nitride semiconductor crystal layer 50.

In this embodiment, a method is provided in which, in order to realize the stacked structure described above, the ultrathin silicon crystal layer 40 having a uniform thickness is provided on the base body 20, and the nitride semiconductor crystal layer 50, having a greater thickness than the ultrathin silicon crystal layer 40, is stacked on the ultrathin silicon crystal layer 40.

Specifically, the thickness of the ultrathin silicon crystal layer 40 is 50 nm or less, and more preferably 20 nm or less.

On the other hand, in a method of a reference example in which a nitride semiconductor crystal layer is epitaxially grown directly on a silicon crystal substrate having a thickness of not less than 500 μm and not more than 1000 μm, as a thickness of the nitride semiconductor crystal layer increases, strain caused by lattice mismatching between the nitride semiconductor crystal and the silicon crystal increases, and, eventually, by introducing a dislocation in the nitride semiconductor crystal side in order to relax this stress, a plastic deformation occurs, and the accumulated stress is relaxed. As a result, a large amount of dislocations, approximately $1 \times 10^8$ (number of dislocations·$cm^{-2}$), remain in the nitride semiconductor crystal layer formed on the silicon crystal substrate.

On the other hand, as in this embodiment, when the ultrathin silicon crystal layer 40 is prepared and the nitride semiconductor crystal layer 50, having a greater thickness than a thickness of the ultrathin silicon crystal layer 40, is grown thereon, the strain that accompanies the growth thickness of the nitride semiconductor crystal layer can be relaxed by the introduction of a dislocation 40t into the ultrathin silicon crystal layer 40 side of the base material.

Specifically, when the thickness of the silicon crystal layer 40 of the base material is sufficiently greater than the thickness of the epitaxially grown nitride semiconductor crystal layer 50, happening of the plastic deformation associated with the introduction of the dislocation on the base material side will be difficult, but when the film thickness of the silicon crystal layer 40 of the base material is sufficiently less than the thickness of the nitride semiconductor crystal layer 50, happening of the plastic deformation associated with the dislocation generation on the silicon crystal layer 40 side of the base material becomes easy.

In this embodiment, a structure is prepared in which the ultrathin silicon crystal layer 40 having the uniform film thickness is stacked directly on the base body 20 or is stacked via an intermediate layer 30, which has not inherited a crystal profile of the base body 20. By epitaxial growth of the nitride semiconductor crystal layer 50 on the ultrathin silicon crystal layer 40, it becomes possible to generate the plastic deformation associated with the introduction of the dislocation 40t with good reproducibility on the ultrathin silicon crystal layer 40 side.

On the other hand, if the silicon crystal layer 40 base material on which the nitride semiconductor crystal layer 50 is epitaxially grown is non-uniform and has portions that are partially thick, it will not be possible to cause the stress relaxation through the generation of the plastic deformation associated with the generation of the dislocation on the base material side. Rather, a plastic deformation associated with the dislocation generation will occur on the nitride semiconductor crystal layer 50 side stacked on top. Thereby, it will not be possible to sufficiently reduce the dislocation density in the nitride semiconductor crystal layer 50.

The ultrathin silicon crystal layer 40 described in this embodiment is formed on the base body 20 that has a crystal profile that differs from the crystal profile of the ultrathin silicon crystal layer 40. For example, a structure wherein the ultrathin silicon crystal layer 40 is stacked on a silica glass substrate that is the base body 20, or the like, can be given.

When using silicon crystal substrates (silicon substrates) having large diameter, such as those used widely to make electronic devices, as the base body 20, the ultrathin silicon crystal layer 40 is stacked on the silicon crystal substrate via the intermediate layer 30.

Specifically, in one example, a silicon oxide film ($SiO_2$) is used as the intermediate layer 30. For example, a structure in which a thin film Si crystal layer is stacked on a silicon substrate crystal via a $SiO_2$ layer is known as a "Silicon on Insulator" (SOI) structure, and products having high industrial quality are being supplied.

In many cases, a thickness of an SOI layer of an SOI substrate generally supplied for use in electronic devices such as integrated circuits and the like is approximately not less than 100 nm and not more than 1 μm. However, by thermally oxidizing a surface thereof, it is easy to reduce the thickness of the SOI layer with a high degree of precision.

Furthermore, in this embodiment, a base material layer that directly supports the ultrathin silicon crystal layer 40 need not necessarily be a silicon glass or $SiO_2$ layer, need not necessarily be an amorphous layer, and may be a crystal layer. In other words, it is sufficient that the base material layer of the silicon crystal layer 40 be a material that does not have a common crystal profile with the ultrathin silicon crystal layer 40.

However, as described hereinafter, the base material layer is configured to have low reactivity with group III elements such as gallium (Ga), indium (In), and the like, and be stable in thermal processes at approximately 1000° C.

In this embodiment, the ultrathin silicon crystal layer 40 is stacked on the base body 20 having low reactivity with group III elements such as gallium (Ga), indium (In), and the like, or on the intermediate layer 30, and the nitride semiconductor crystal layer 50 is epitaxially grown. Therefore, melt back etching of the silicon crystal layer 40 by a group III element is limited.

Specifically, according to this embodiment, because the thickness of the ultrathin silicon crystal layer 40 is 50 nm or less, after stacking the nitride semiconductor crystal layer 50 on the ultrathin silicon crystal layer 40 at a low temperature, even when performing processes at high temperatures, a maximum region that will be subjected to melt back etching by the group III element is limited to the thickness of the ultrathin silicon crystal layer 40 (50 nm) or less.

In this embodiment, when the ultrathin silicon crystal layer 40 is stacked on the base body 20 via the intermediate layer 30, and then the nitride semiconductor crystal layer 50 is epitaxially grown thereon, a portion or all of the silicon atoms constituting the ultrathin silicon crystal layer 40 react with the nitride semiconductor crystal layer 50, interdiffusion of the gallium atoms and the silicon atoms occurs, and the silicon atoms are incorporated into the nitride semiconductor crystal. As a result, compared to before the growth of the nitride semiconductor crystal layer 50, the film thickness of the ultrathin silicon crystal layer 40 is further reduced, or the ultrathin silicon crystal layer 40 disappears. However, a gross amount of the silicon atoms diffused in the nitride semiconductor crystal layer 50 is limited, and it is possible to reduce the impact on conductivity type control of the nitride semiconductor crystal layer 50.

Furthermore, when the thickness of the nitride semiconductor crystal layer 50 is sufficiently greater than the thickness of the ultrathin silicon crystal layer 40 (specifically, when 1 μm or more), the stacked structure actually produced can be considered to be a three-layer structure including the base body 20, the intermediate layer 30, and the nitride semiconductor crystal layer 50.

Here, when the base body 20 is the silicon crystal substrate and the intermediate layer 30 is the $SiO_2$ layer, the three-layer structure of the silicon crystal substrate, the $SiO_2$ layer, and the nitride semiconductor crystal layer 50 is formed, and compared to when the nitride semiconductor crystal layer is stacked on the silicon substrate crystal as in the reference example, a structure is formed in which the $SiO_2$ layer is interposed between both of the crystal layers. In the reference example, after stacking the nitride semiconductor crystal layer on the silicon crystal substrate, a problem of cracking caused by a difference between thermal expansion coefficients of both constituents when lowering the temperature existed. However, according to this embodiment, a structure is formed wherein the $SiO_2$ layer having a small thermal expansion coefficient is interposed between the silicon substrate layer having a relatively large thermal expansion coefficient and the nitride semiconductor (gallium nitride) layer having an even larger thermal expansion coefficient.

Additionally, in this embodiment, specific thicknesses of the constituents of the stacked structure are: the silicon crystal substrate (not less than 400 μm and not more than 1000 μm); the $SiO_2$ layer (not less than 100 nm and not more than 1000 nm), and the nitride semiconductor crystal layer (not less than 1 μm and not more than 10 μm). Thereby, contraction caused by the difference in the thermal expansion coefficients during the cooling process after the forming of the nitride semiconductor crystal layer is balanced by the interposing of the $SiO_2$ layer having a small amount of thermal contraction. Therefore, warping that occurs in a two-layer structure of the silicon crystal substrate and the nitride semiconductor crystal layer and cracking associated with the warping can be avoided.

Next, the first embodiment will be described in more detail.

FIGS. 3A and 3B and FIGS. 4A and 4B are schematic cross-sectional views illustrating the method for manufacturing a nitride semiconductor crystal layer according to the first embodiment.

Figure 3A:
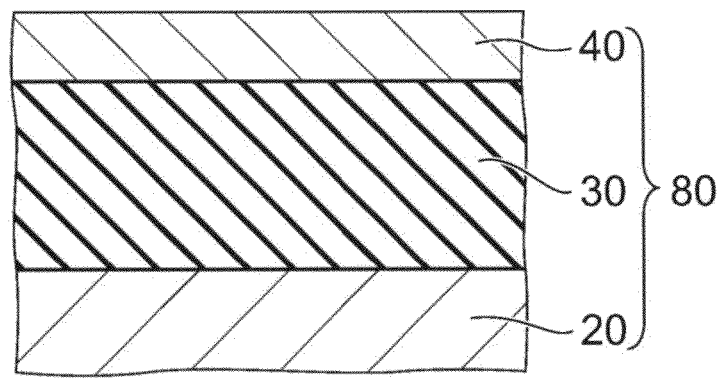
FIGS. 3A and 3B are schematic cross-sectional views illustrating the method for manufacturing a nitride semiconductor crystal layer according to the first embodiment.

As illustrated in FIG. 3A, a substrate 80 having a Silicon on Insulator (SOI) structure is prepared as the substrate. A thickness of the base body 20 that is a base body substrate crystal is 650 μm; a thickness of the intermediate layer 30 that is an buried oxide film layer is 200 nm, and a thickness of the top ultrathin silicon crystal layer (SOI layer) 40 is 10 nm. An orientation of a crystal plane of the SOI layer of the surface is a (111) plane. Any crystal orientation may be used for the base body 20, essentially without causing any problems. In this embodiment, the crystal orientation of the base body 20 is a (100) plane. The silicon crystal that is the base body 20 may be a polycrystal without causing problems. Furthermore, the substrate 80 may have a structure in which the ultrathin silicon crystal layer 40 is attached to a silica substrate.

Here, when the thickness of the ultrathin silicon crystal layer (SOI layer) 40 is great, the ultrathin layer having a thickness of 10 nm can be obtained by oxidizing a surface layer through thermal oxidation and reducing the thickness of the silicon crystal layer (SOI layer) 40. After the thermal oxidation, the surface oxidized film can be easily removed through hydrofluoric acid treating. Additionally, when there is not a thermally oxidized film adhered to the surface, a sample substrate is treated with a dilute hydrofluoric acid solution having a concentration of approximately 1% for about one minute in order to make hydrogen termination on the substrate surface. Through this hydrogen termination, the silicon crystal layer (SOI layer) 40 becomes a surface structure terminated by hydrogen, and becomes a water-repellent surface.

Figure 3B:
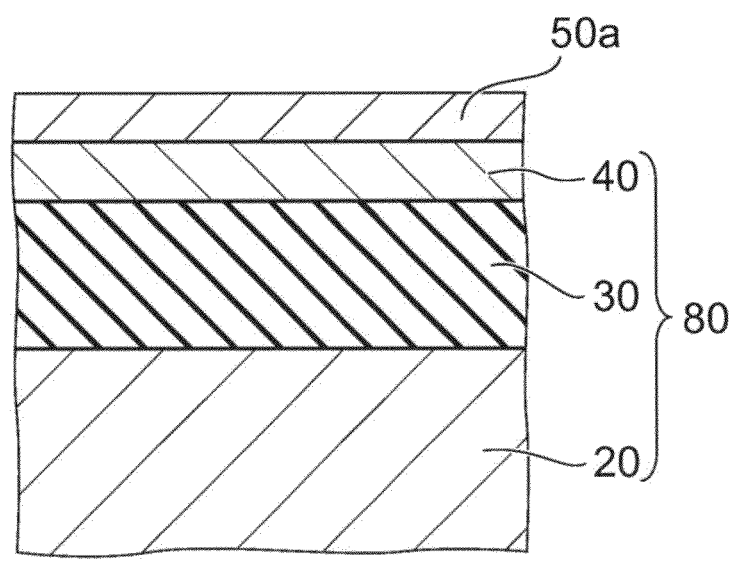

Next, as illustrated in FIG. 3B, a nitride semiconductor crystal layer 50a (gallium nitride crystal layer) is grown (epitaxially grown) on the ultrathin SOI layer having the hydrogen terminated surface. The substrate 80 that is the sample substrate is introduced into a MOCVD (Metal Organic Chemical Vapor Deposition) apparatus, a substrate temperature is raised to 500° C., and the nitride semiconductor crystal layer 50a, having a thickness of 20 nm, is formed using TMG (trimethylgallium) and $NH_3$ (ammonia) as source materials.

Figure 4A:
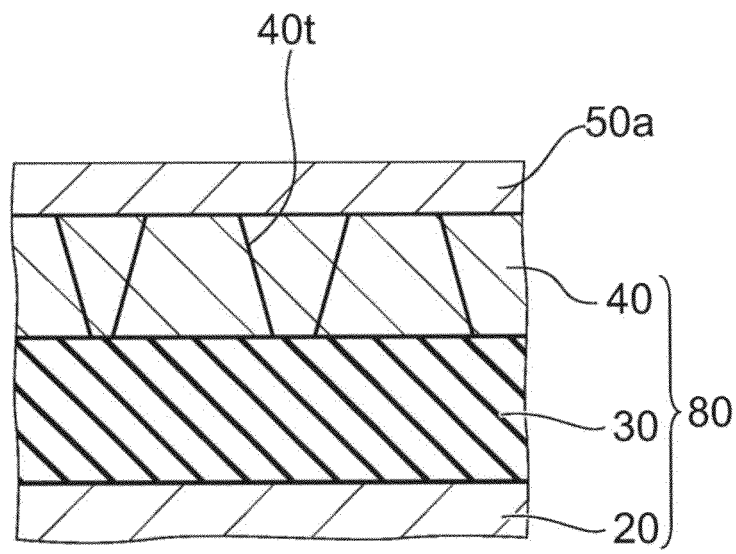
FIGS. 4A and 4B are schematic cross-sectional views illustrating the method for manufacturing a nitride semiconductor crystal layer according to the first embodiment.

Next, as illustrated in FIG. 4A, the temperature of the substrate 80 is raised to 1080° C. At this time, a plastic deformation occurs by introducing the dislocation 40t on the ultrathin silicon crystal layer 40 side due to the stress caused by the lattice mismatching between the nitride semiconductor crystal layer 50a and the ultrathin silicon crystal layer 40. Additionally, the strain that was applied to the nitride semiconductor crystal layer 50a is released due to the plastic deformation of the ultrathin silicon crystal layer 40. The condition at this stage is schematically illustrated in FIG. 4A.

Figure 4B:
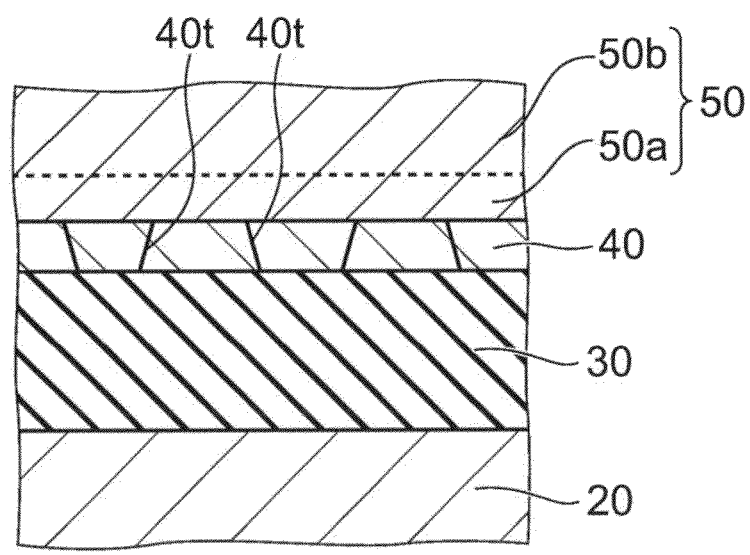

As illustrated in FIG. 4B, next, at 1080° C., a nitride semiconductor crystal layer 50b (gallium nitride crystal layer) having a thickness of 2 μm is formed using TMG (trimethylgallium) and $NH_3$ (ammonia) as source materials.

Furthermore, at this stage, a portion or all of the silicon atoms constituting the ultrathin silicon crystal layer 40 react with the nitride semiconductor crystal layer 50, interdiffusion of the gallium atoms and the silicon atoms occurs, and the silicon atoms are incorporated into the nitride semiconductor crystal. As a result, compared to before the growth of the nitride semiconductor crystal layer 50, the film thickness of the ultrathin silicon crystal layer 40 is further reduced, or the ultrathin silicon crystal layer 40 disappears.

Furthermore, while it is mentioned previously that the nitride semiconductor crystal layer 50a formed at a low temperature relaxes its lattice when the temperature is raised to 1080° C., even if the nitride semiconductor crystal layer 50a is not completely relaxed and a partial strain remains at this stage, the nitride semiconductor crystal layer 50a having complete lattice relaxation would be obtained at the stage when the nitride semiconductor crystal layer 50b, having a thickness of 2 µm, is grown at a high temperature.

When fabricating optical semiconductor devices exemplified by Light Emitting Diodes (LEDs), it is possible to stack a light emitting layer formed from InGaN or the like on the nitride semiconductor crystal layer 50 (described hereinafter). Additionally, it is possible to dope the nitride semiconductor crystal layer 50 with n-type Si, p-type Mg, or the like in order to inject current to cause the light emitting layer to emit light. Normally, it is also possible to perform the doping in the process of growth of the gallium nitride at 1080° C., and it is also possible to form the layer with the silicon atoms at approximately $1 \times 10^{18}$ (atoms·cm$^{-3}$) in order to form an n-type layer on the base material substrate side. However, in cases such as this embodiment where the nitride semiconductor crystal layer 50 is formed on the ultrathin silicon crystal layer 40, the gallium atoms in the nitride semiconductor crystal layer 50 react with the silicon crystal, and the silicon atoms are diffused into the nitride semiconductor crystal layer 50.

Specifically, silicon atoms at a concentration of not less than $1 \times 10^{19}$ (atoms·cm$^{-3}$) and not more than $1 \times 10^{20}$ (atoms·cm$^{-3}$) are contained in 500 nm of the gallium nitride crystal layer contacting the ultrathin silicon crystal layer 40 (bottom part of the growth layer), even without the doping wherein monosilane gas is introduced during the growth. Therefore, the thickness of the ultrathin silicon crystal layer 40 is either less than before the forming of the nitride semiconductor crystal layer 50 or has completely disappeared. When using a conventional silicon crystal substrate in place of the ultrathin SOI layer as the substrate, an even greater amount of silicon atoms will diffuse into all regions of the nitride semiconductor crystal layer 50, and the bottom part of the growth layer will take on a form close to that of a mixed crystal of silicon and gallium nitride.

In this embodiment, Metal Organic Chemical Vapor Deposition (MOCVD) is given as a technique for the thin film crystal growth of the nitride semiconductor crystal layer 50, but any conventional thin film crystal growth method used in the growth of nitride semiconductor crystals such as Molecular Beam Epitaxy (MBE) and Hydride Vapor Phase Epitaxy (HVPE) may be used.

Generally, lattice constants of compound semiconductor crystals differ from silicon crystals. Therefore, forming a compound semiconductor crystal on a silicon substrate crystal is difficult. For example, when a GaAs crystal is epitaxially grown on a silicon substrate, dislocations are generated in the GaAs crystal because lattice constants of a silicon crystal differs from that of a GaAs crystal by about 4%. Therefore, the GaAs crystal grown on Si substrate would relax by generating dislocations in the grown layer, and high quality GaAs crystal cannot be obtained.

In recent years, nitride semiconductor crystals have been attracting attention for use as light emitting device materials. In the nitride semiconductor crystals, in many cases, hexagonal crystals are used, which have a different crystal form than the cubic crystal form that is normally taken by silicon crystals. In addition, a difference in the lattice constants is much larger. Moreover, there is a problem that cracking occurs in each time a thermal process, such as raising or lowering a temperature, because a difference in thermal expansion coefficients of nitride semiconductor crystals and silicon crystals is large.

In order to solve these problems, techniques have been proposed such as preparing a thin film silicon layer on a silicon substrate via a fragile silicon crystal layer followed by forming a lattice-mismatched compound semiconductor crystal layer thereon. Specifically, a technique is described in the reference example where a porous silicon layer is formed on top of the silicon substrate, followed by forming a continuous and flat ultrathin layer on the surface, and then a compound semiconductor layer is epitaxially grown.

In this technique, crystal defects introduced due to lattice mismatching with the silicon, and due to differences in thermal expansion coefficients and cooling from film forming temperatures to ambient temperature are considered to be introduced only into the ultrathin silicon layer. However, with this method, at conditions where a porosity of the porous layer is great (when a proportion of the porous layer accounted for by vacancies is large) it is difficult to form a flat ultrathin layer on the surface. As described in the reference example, at conditions where the porosity is small at 20%, even though the ultrathin layer is formed flat on the surface, the silicon crystal part is connected to the base material in 80% of an area of the ultrathin layer. Thus, the ultrathin portion actually only accounts for 20%. Therefore, for the object of introducing a defect in order to reduce the strain caused by the lattice mismatching with the stacked compound semiconductor crystal layer, problems of reproducibility remain.

In another reference example, a method is proposed in which the nitride semiconductor crystal layer is epitaxially grown directly on the porous layer formed on the top of the silicon substrate. It is thought that strains caused by lattice mismatching and strains caused by differences in thermal expansion coefficients between the substrate and the nitride semiconductor may be reduced by the porous layer. However, with this method, the base material on which the compound semiconductor crystal layer is grown is not flat. The crystal growth begins from protrusions that are discontinuously exposed from the surface of the porous layer. Therefore, immediately after the growth begins, isolated crystals are formed and they eventually coalesce in a lateral direction. In this case, lattice constants and crystal forms in the silicon crystal serving as the base material are different from those of the compound semiconductor crystal that has been grown. Grain boundary is formed at the portion where coalescence proceeds between the crystals started being grown independently, and defects are generated. These lead to problems.

In addition, in yet another reference example, there is a problem of melt back etching of the silicon crystal part by the GaN crystal when forming the nitride semiconductor crystal on the silicon crystal. Specifically, nitrogen is sublimated at a high temperature from the GaN crystal stacked on the silicon crystal and the Ga atoms are segregated, then the silicon crystal part is melt back etched and cavities are formed in an interface portion. Furthermore, the silicon atoms separated from the melt back etched silicon crystal part diffuse into the top GaN crystal. They become highly concentrated n-type impurities and the controllability of the conductivity type is degraded.

Thus, in the reference examples, there are various problems that occur when stacking the compound semiconductor crystal, particularly the nitride semiconductor crystal on the silicon substrate.

On the other hand, in this embodiment, a structure and a technique for obtaining a high-quality crystal layer are provided to form the compound semiconductor crystal layer, particularly the nitride semiconductor crystal layer, having a lattice constant that differs greatly from the lattice constant of the base material silicon substrate crystal. The structure and the technique realize to suppress the introducing of the dislocation caused by the lattice mismatch on the nitride semiconductor crystal side. A technique thereof is also provided.

With this embodiment, a structure and a technique are provided to suppress the problem of the silicon crystal being melt back etched by the group III atoms when the nitride semiconductor crystal layer is stacked on the silicon substrate. They also suppress the problem of conductivity type control becoming troublesome due to a great quantity of silicon atoms of the portion that was melt back etched diffusing into the nitride semiconductor layer.

Cracking occurs when cooling after the forming of the thin film at a high temperature caused by the difference in the thermal expansion coefficient in stacking the nitride semiconductor crystal layer on the silicon substrate. With this embodiment, a structure and a technique are provided to reduce a density of cracking.

According to the embodiment, the nitride semiconductor crystal layer 50 having a greater thickness than the ultrathin silicon crystal layer 40 is stacked on the ultrathin silicon crystal layer 40. The ultrathin silicon crystal layer 40 does not inherit the crystal profile of the base material and has a uniform thickness. Thereby, it is possible to generate the dislocation 40t caused by the lattice mismatch on the ultrathin silicon crystal layer 40 side and to reduce the dislocation 40t introduced into the nitride semiconductor crystal layer 50.

In this embodiment, the ultrathin silicon crystal layer 40 is stacked on the base body having low reactivity with group III elements, or via the intermediate layer 30 having low reactivity with group III elements interposed on the base body. The nitride semiconductor crystal layer 50 having a greater thickness than the ultrathin silicon crystal layer 40 is stacked thereon. Thereby, even when the silicon crystal portion is melt back etched by the nitride semiconductor crystal layer 50, it is possible to limit an amount of the melt back etching. Thereby the amount of the silicon atoms diffused into the nitride semiconductor crystal layer 50 side are suppressed and problems with controlling the conductivity type of the nitride semiconductor crystal layer 50 are avoided.

In this embodiment, the ultrathin silicon crystal layer 40 is stacked on the base body 20 formed from the silicon crystal via the intermediate layer 30 formed from the $SiO_2$ layer, and the nitride semiconductor crystal layer 50 is epitaxially grown thereon. By this process, a three-layer structure is formed wherein the $SiO_2$ layer having a small thermal expansion coefficient is interposed between the silicon substrate layer having a relatively large thermal expansion coefficient, and the nitride semiconductor layer (gallium nitride) having a much larger thermal expansion coefficient. Thereby, shrinkage caused by the difference in the thermal expansion coefficients when cooling after the forming of the nitride semiconductor crystal layer 50 is balanced by the interposing the $SiO_2$ layer having a small thermal shrinkage. Therefore, warping in a two-layer structure of the silicon substrate and the nitride semiconductor crystal layer is suppressed and cracking associated with the warping can be suppressed.

Next, a configuration of a semiconductor device fabricated using the nitride semiconductor crystal layer 50 according to the first embodiment will be described.

Figure 5A:
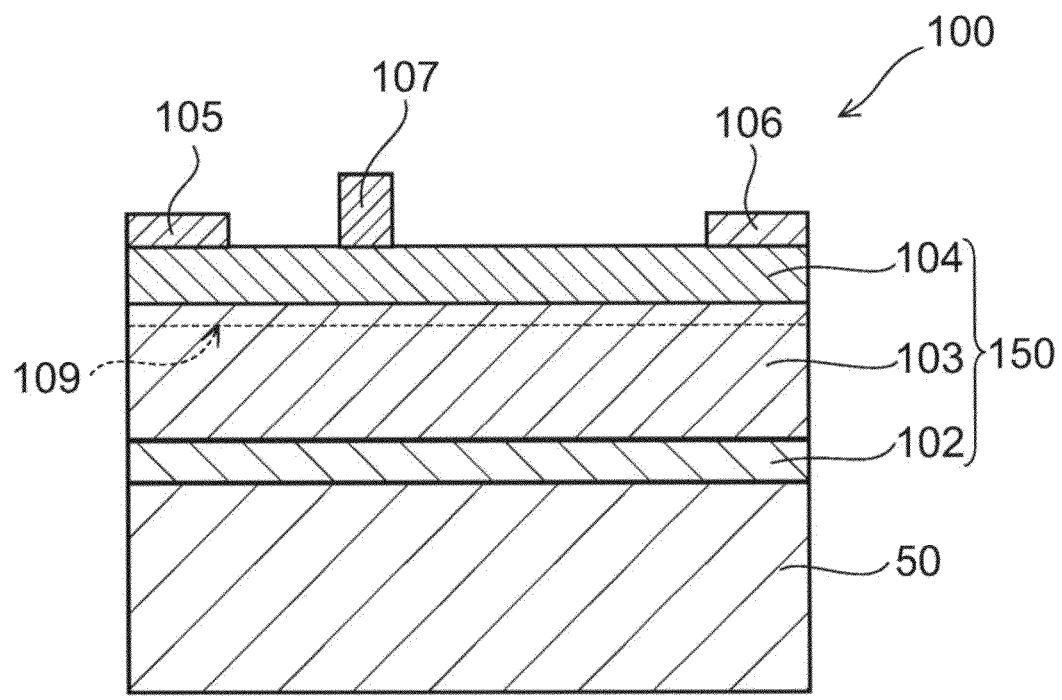
FIGS. 5A and 5B are schematic cross-sectional views illustrating the configuration of a semiconductor device fabricated by the method for manufacturing a nitride semiconductor crystal layer according to the first embodiment.
Figure 5B:
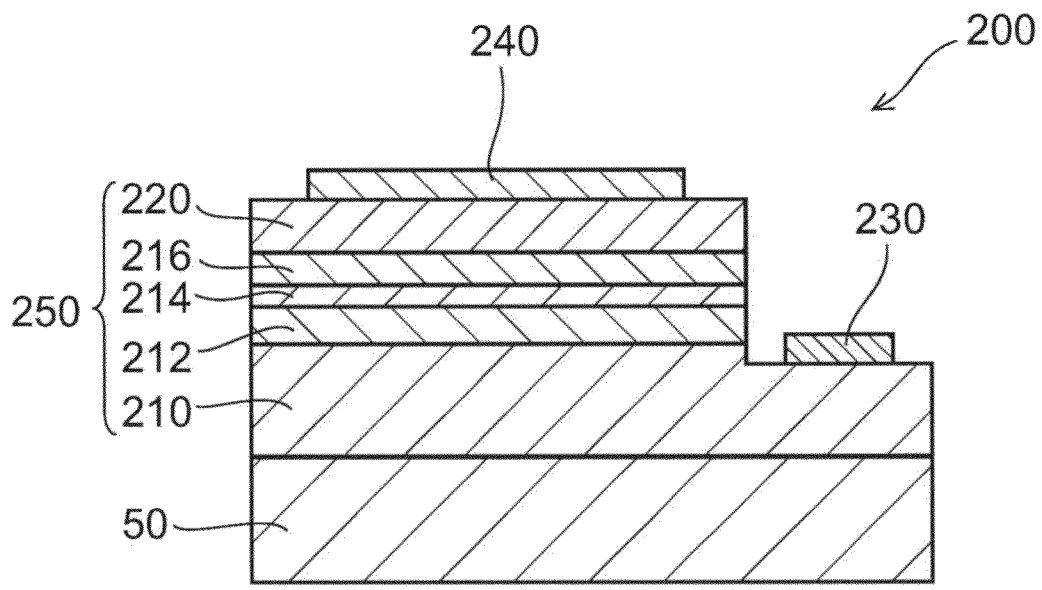

FIGS. 5A and 5B are schematic cross-sectional views illustrating a configuration of a semiconductor device fabricated using the method for manufacturing a nitride semiconductor crystal layer according to the first embodiment.

First, an example of a semiconductor device fabricated using the method for manufacturing a nitride semiconductor crystal layer according to this embodiment will be described using FIGS. 5A and 5B. Here, a gallium nitride (GaN) High Electron Mobility Transistor (HEMT), and a gallium nitride Light Emitting Diode (LED) are described as examples of the semiconductor device.

As illustrated in FIG. 5A, a semiconductor device 100 is a GaN HEMT. In the semiconductor device 100, a semiconductor stacked body 150 is provided on a nitride semiconductor crystal layer 50. Specifically, for example, the semiconductor device 100 includes a first semiconductor layer 103 provided on the nitride semiconductor crystal layer 50 via a buffer layer 102, and a second semiconductor layer 104, having a greater band gap than the first semiconductor layer 103. The first semiconductor layer 103 is a channel layer and the second semiconductor layer 104 is a barrier layer. A heterojunction exists between the first semiconductor layer 103 and the second semiconductor layer 104. The buffer layer 102, the first semiconductor layer 103, and the second semiconductor layer 104 are epitaxially grown subsequently on the nitride semiconductor crystal layer 50.

The first semiconductor layer 103 includes, for example, undoped $Al_\alpha Ga_{1-\alpha}N$ (where $0 \leq \alpha \leq 1$), not including impurities. The second semiconductor layer 104 includes, for example, undoped or n-type $Al_\beta Ga_{1-\beta}N$ (where $0 \leq \beta \leq 1$ and $\alpha < \beta$). For example, an undoped GaN layer is used for the first semiconductor layer 103 and an undoped or n-type AlGaN layer is used for the second semiconductor layer 104. An AlN layer or an AlGaN layer is used, for example, for the buffer layer 102. Note that the buffer layer 102 is not necessary and can be omitted.

A source electrode 105 and a drain electrode 106 are provided mutually spaced on the second semiconductor layer 104. The source electrode 105 and the drain electrode 106 each are in ohmic contact with a surface of the second semiconductor layer 104. A gate electrode 107 is provided on the second semiconductor layer 104 between the source electrode 105 and the drain electrode 106. The gate electrode 107 is in Schottky contact with the surface of the second semiconductor layer 104.

A lattice constant of the second semiconductor layer 104 is smaller than a lattice constant of the first semiconductor layer 103. Thereby, strain is generated in the second semiconductor layer 104 and piezoelectric polarization is generated in the second semiconductor layer 104 due to piezoelectric effect. Thereby, a two-dimensional electron gas 109 is formed in a vicinity of an interface between the first semiconductor layer 103 and the second semiconductor layer 104. In the semiconductor device 100, by controlling gate voltage applied to the gate electrode 107, a concentration of the two-dimensional electron gas 109 under the gate electrode 107 is varied, and current between the source electrode 105 and the drain electrode 106 is changed.

As illustrated in FIG. 5B, a semiconductor device 200 is a GaN LED. In the semiconductor device 200, a semiconductor stacked body 250 is provided on a nitride semiconductor crystal layer 50. For example, the semiconductor device 200 includes an n-type GaN layer 210 provided on the nitride semiconductor crystal layer 50, an n-type GaN guide layer 212 provided on the n-type GaN layer 210, an active layer 214 provided on the n-type GaN guide layer 212, a p-type GaN guide layer 216 provided on the active layer 214, and a p-type GaN layer 220 provided on the p-type GaN guide layer 216. The active layer 214 contains InGaN, and has, for example, a Multi-Quantum Well (MQW) construction wherein an $In_{0.15}Ga_{0.85}N$ layer and an $In_{0.02}Ga_{0.98}N$ layer are stacked.

In the semiconductor device 200, a portion of a surface of the n-type GaN layer 210 is exposed, and an n-side electrode 230 is provided on the n-type GaN layer 210 of the exposed portion. A p-side electrode 240 is provided on the p-type GaN layer 220.

When a predetermined voltage is applied between the n-side electrode 230 and the p-side electrode 240, holes and electrons in the active layer 214 recombine and blue light, for example, is emitted from the active layer 214. The light emitted from the active layer 214 is extracted from the nitride semiconductor crystal layer 50 side or the p-side electrode 240 side.

Such a semiconductor device (i.e. the semiconductor devices 100 and 200) are fabricated using a nitride semiconductor crystal layer. Hereinafter, a method for manufacturing a nitride semiconductor crystal layer according to this embodiment will be described.

Second Embodiment

FIGS. 6A and 6B and FIGS. 7A to 7C are schematic cross-sectional views illustrating the method for manufacturing a nitride semiconductor crystal layer according to a second embodiment.

Figure 6A:
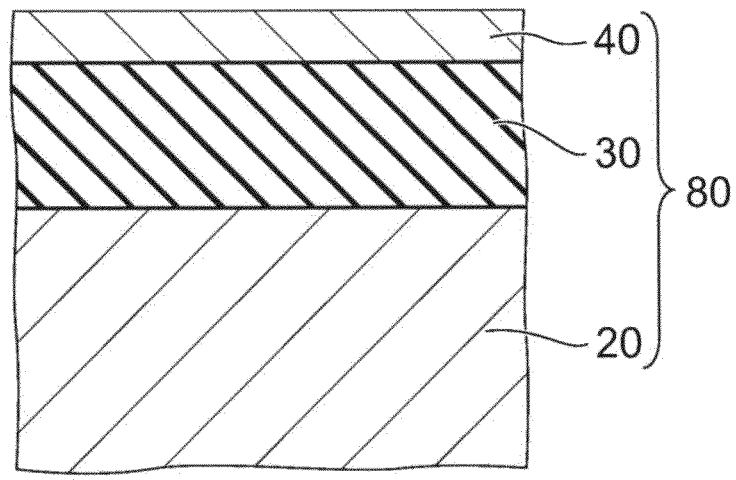
FIGS. 6A and 6B are schematic cross-sectional views illustrating a method for manufacturing a nitride semiconductor crystal layer according to a second embodiment.

As illustrated in FIG. 6A, a substrate 80 having a Silicon on Insulator (SOI) structure is prepared as the substrate. A thickness of the base body 20 that is a base body substrate crystal is 650 μm; a thickness of the intermediate layer 30 that is a buried oxide film layer is 200 nm, and a thickness of the top ultrathin silicon crystal layer (SOI layer) 40 is 10 nm. An orientation of a crystal plane of the surface SOI layer is a (111) plane. Any crystal orientation may be used for the base body, essentially without causing any problems. In this embodiment, the crystal orientation is a (100) plane. A sample substrate is treated with a dilute hydrofluoric acid solution having a concentration of approximately 1% for about one (1) minute in order to make hydrogen termination on the ultrathin SOI layer surface of the substrate surface. Through this hydrogen termination, the SOI layer surface becomes a surface structure terminated by hydrogen, and becomes a water-repellent surface. Next, a nitride semiconductor crystal layer 50a (gallium nitride crystal layer) is thin film crystal grown (epitaxially grown) on the ultrathin SOI layer substrate having the hydrogen terminated surface.

Figure 6B:
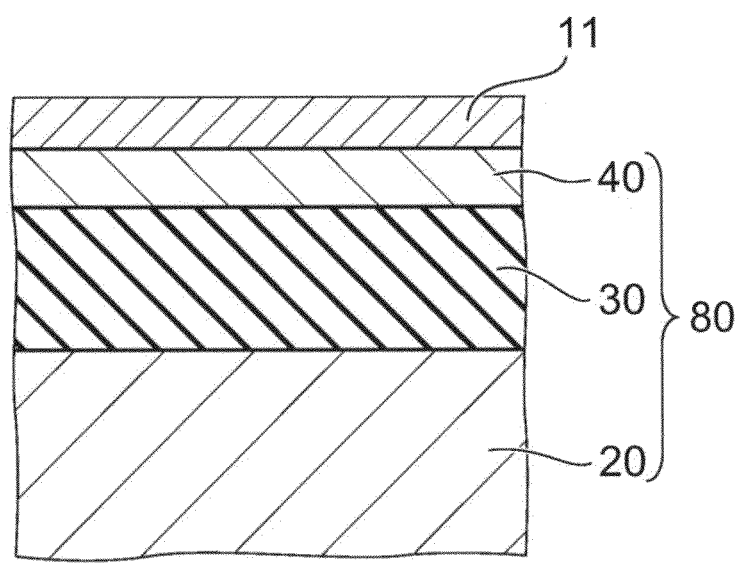

For example, as illustrated in FIG. 6B, the sample substrate is introduced into a Metal Organic Chemical Vapor Deposition (MOCVD) apparatus, and a substrate temperature is raised to 500° C. Then, before the growth of the nitride semiconductor crystal layer at a low temperature, only TMG is supplied and gallium atoms of equivalent to a three-atom layer are deposited on a surface of an ultrathin silicon crystal layer 40. Thereby, a gallium atom layer 11 is formed. At this stage, a portion of the gallium atoms are diffused into the ultrathin silicon crystal layer 40.

Figure 7A:
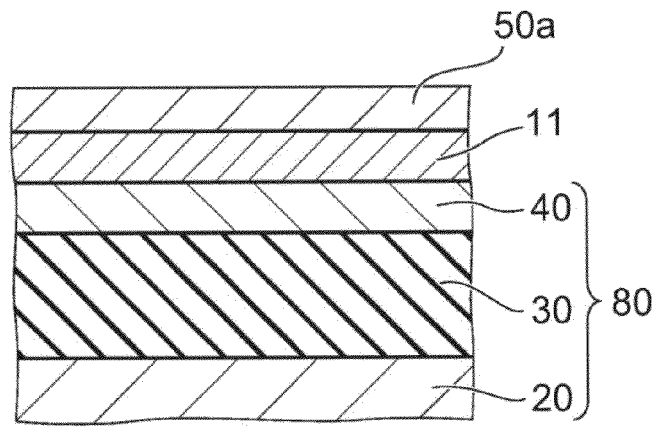
FIGS. 7A to 7C are schematic cross-sectional views illustrating the method for manufacturing a nitride semiconductor crystal layer according to the second embodiment.

Next, as illustrated in FIG. 7A, the nitride semiconductor crystal layer 50a (gallium nitride crystal layer) having a thickness of 20 nm is formed using TMG (trimethylgallium) and NH₃ (ammonia) as source materials.

Figure 7B:
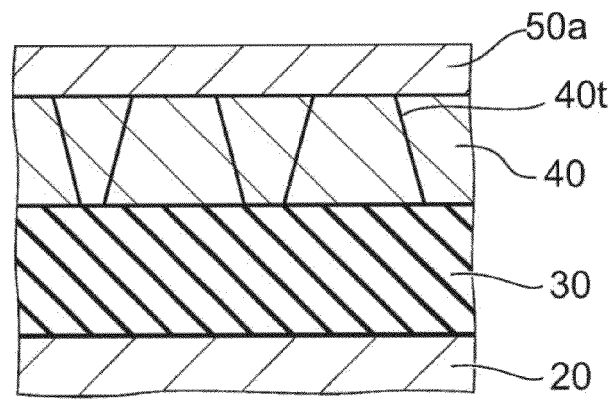

Next, as illustrated in FIG. 7B, the temperature of the substrate 80 is raised to 1080° C. At this time, a plastic deformation occurs by introducing the dislocation 40t on the ultrathin silicon crystal layer 40 side due to the stress caused by the lattice mismatching between the nitride semiconductor crystal layer 50a and the ultrathin silicon crystal layer 40. Additionally, the strain that was applied to the nitride semiconductor crystal layer 50a is released due to the plastic deformation of the ultrathin silicon crystal layer 40.

In this embodiment, because the gallium atoms are diffused into the ultrathin silicon crystal layer 40 beforehand, the plastic deformation in the ultrathin silicon crystal layer 40 caused by the introduction of the dislocation 40t occurs easily. Diffusing gallium atoms in a silicon crystal while changing lattice positions is well known. With the conditions of this embodiment, the gallium atoms are diffused to a bottom-most portion (interface between the silicon crystal layer 40 and the intermediate layer 30) of the silicon crystal layer 40 that has a thickness of 10 nm. Therefore, the introduction of the dislocation into the silicon crystal is facilitated. Specifically, the dislocation introduced from the silicon crystal layer surface (growth interface of the nitride semiconductor crystal layer) brings a higher probability of occurrence of plastic deformation effect when the diffusion of Ga atoms penetrates through the whole silicon crystal layer until the intermediate layer interface. Therefore, it is important that the thickness of the silicon crystal layer 40 be a thickness that the gallium atoms easily diffuse.

Additionally, in the first embodiment, the group III element is not introduced prior to the growth of the nitride semiconductor crystal, but it is considered that, when the gallium nitride crystal layer is grown on the silicon crystal layer, the silicon atoms and the gallium atoms are mutually diffused into each layer due to the reaction that occurs at the interface, and therefore, likewise, the gallium atoms are diffused into the silicon crystal layer.

Figure 7C:
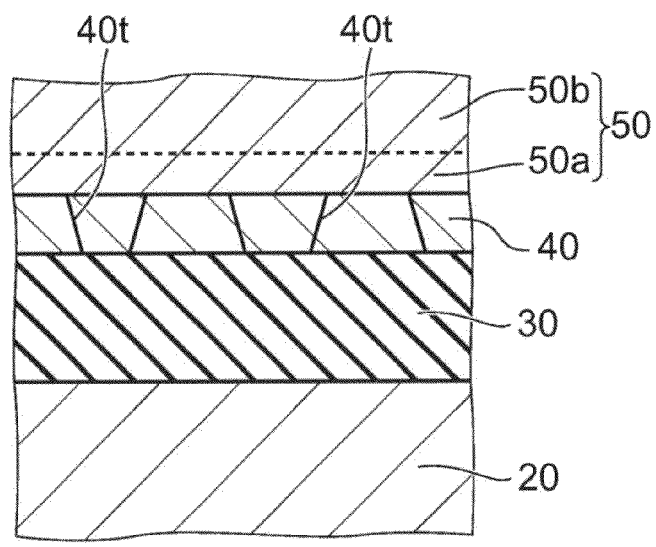

As illustrated in FIG. 7C, next, a nitride semiconductor crystal layer 50b (gallium nitride crystal layer) having a thickness of 2 μm, is formed at 1080° C. using TMG (trimethylgallium) and NH₃ (ammonia) as source materials.

Furthermore, at this stage, a portion or all of the silicon atoms constituting the ultrathin silicon crystal layer 40 react with the nitride semiconductor crystal layer 50, and interdiffusion of the gallium atoms and the silicon atoms occurs, and the silicon atoms are incorporated into the nitride semiconductor crystal. As a result, compared to before the growth of the nitride semiconductor crystal layer 50, the film thickness of the ultrathin silicon crystal layer 40 is further reduced, or the ultrathin silicon crystal layer 40 disappears.

While it is mentioned previously that the nitride semiconductor crystal layer 50a formed at a low temperature displayed relaxes its lattice when the temperature is raised to 1080° C., even if the nitride semiconductor crystal layer 50a is not completely relaxed and a partial strain remains at this stage, the nitride semiconductor crystal layer 50 having complete lattice relaxation would be obtained at the stage when the nitride semiconductor crystal layer 50b, having a thickness of 2 μm, is grown at a high temperature. As in the first embodiment, when fabricating optical semiconductor elements exemplified by Light Emitting Diodes (LEDs), it is advantageous to stack a light emitting layer formed from InGaN or the like on the nitride semiconductor crystal layer 50, and form a p-type layer.

Third Embodiment

FIGS. 8A to 8D and FIGS. 10A to 10C are schematic cross-sectional views illustrating a method for manufacturing a nitride semiconductor crystal layer according to a third embodiment. FIGS. 9A and 9B are schematic views illustrating the method for manufacturing a nitride semiconductor crystal layer according to the third embodiment. Specifically, FIG. 9A is a planar schematic view and FIG. 9B is a cross-sectional view taken across line X-Y of FIG. 9A.

As illustrated in FIG. 9A, a substrate 80 having a Silicon on Insulator (SOI) structure is prepared as the substrate 80. A thickness of the base body 20 that is a base body substrate crystal is 650 μm; a thickness of the intermediate layer 30 that is a buried oxide film layer is 1 μm, and a thickness of the top ultrathin silicon crystal layer (SOI layer) 40 is 20 nm. An orientation of a crystal plane of the surface SOI layer is a (111) plane. Any crystal orientation may be used for the base body, essentially without causing any problems. In this embodiment, the crystal orientation is a (100) plane. Moreover, the ultrathin silicon crystal layer 40 is divided into quadrangular island-like shapes, a length of one side being 1 mm. Thus, the silicon crystal layer 40 can be divided in a plane parallel to a layer face of the silicon crystal layer 40.

Figure 8A:
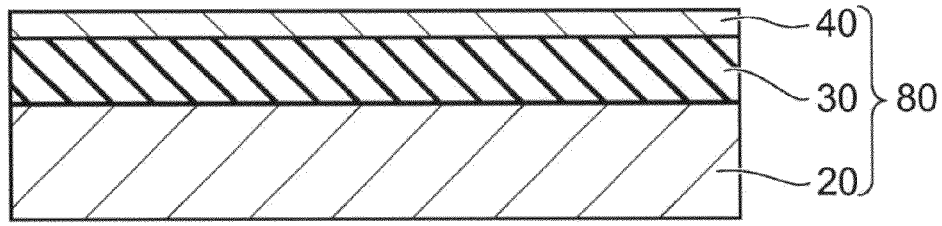
FIGS. 8A to 8D are schematic cross-sectional views illustrating a method for manufacturing a nitride semiconductor crystal layer according to a third embodiment.
Figure 8B:
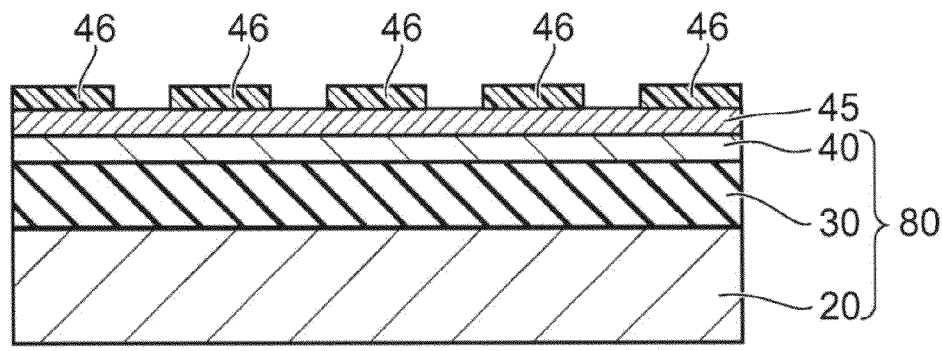
Figure 9A:
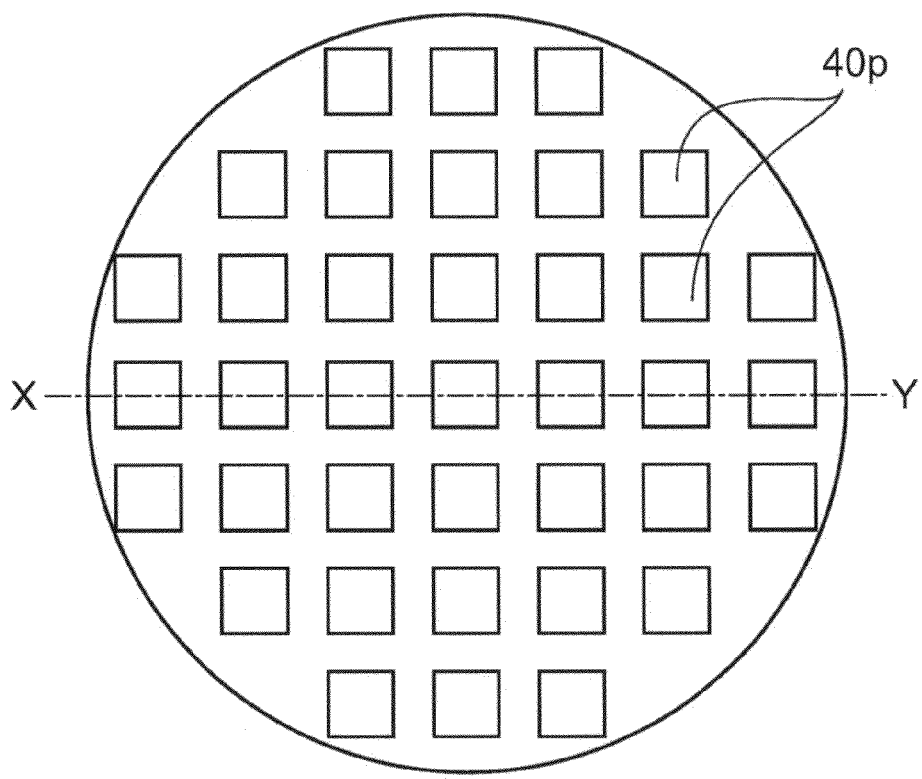
FIGS. 9A and 9B are schematic views illustrating the method for manufacturing a nitride semiconductor crystal layer according to the third embodiment.
Figure 9B:
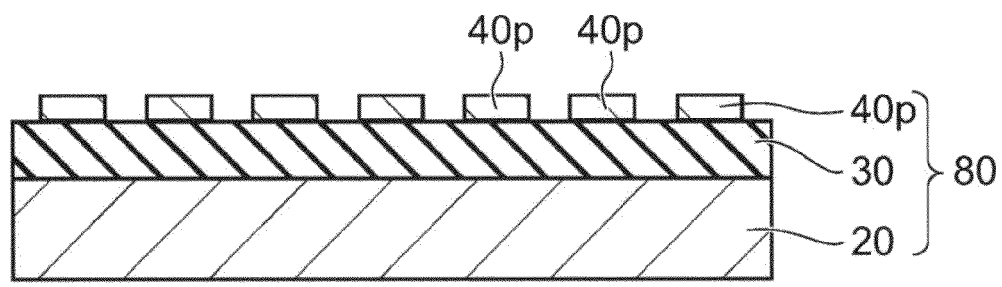

Specifically, as illustrated in FIG. 8B, the procedure includes depositing an oxide film 45 on the ultrathin silicon crystal layer 40 using a CVD method, and forming a mask pattern 46 by applying a photoresist on the oxide film 45.

Figure 8C:
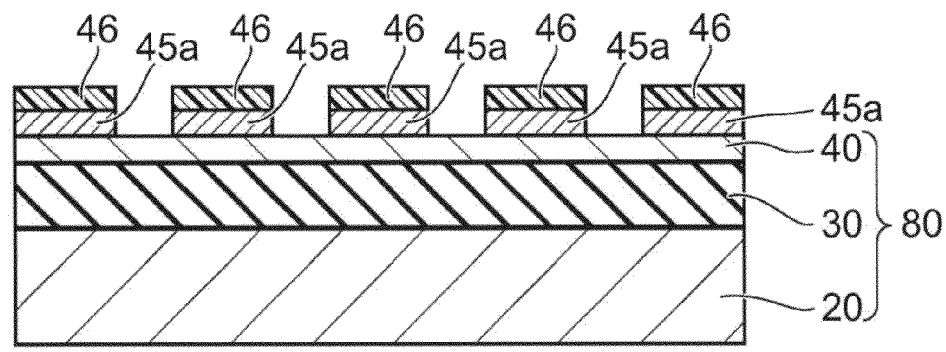

Next, as illustrated in FIG. 8C, the deposited oxide film 45 is etched using dry etching.

Figure 8D:
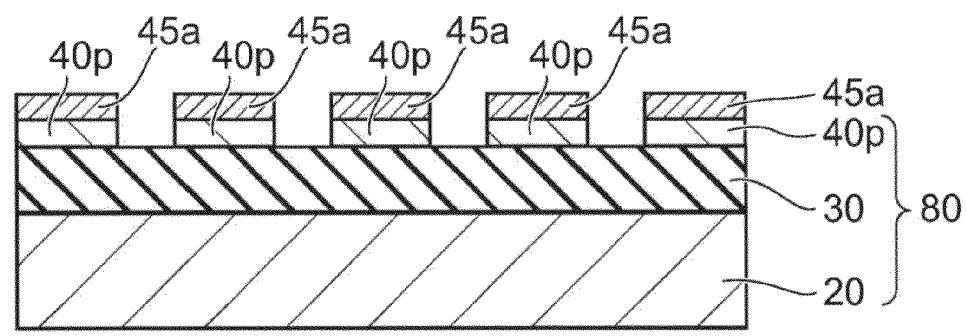

Thereafter, as illustrated in FIG. 8D, the ultrathin silicon crystal layer 40 is etched using the oxide film 45a, which has been patterned by the etching, as a mask. Thereby, a structure is formed in which quadrangular island-like ultrathin silicon parts 40p, with the length of one side being 1 mm, are formed at intervals of 1 mm on the intermediate layer 30 that is a buried oxide film.

A plane and cross-sectional view of the substrate 80 after the oxide film 45a has been removed is illustrated in FIGS. 9A and 9B. As illustrated in FIGS. 9A and 9B, the ultrathin silicon parts 40p are formed, for example, into a structure having intervals of 1 mm.

A sample substrate is treated with a dilute hydrofluoric acid solution having a concentration of approximately 1% for about one minute in order to make hydrogen termination on a surface of the ultrathin silicon parts 40p having quadrangular island-like shapes. Through this hydrogen termination, the surface of the ultrathin silicon parts 40p becomes a surface structure terminated by hydrogen, and becomes a water-repellent surface. Next, the nitride semiconductor crystal layer 50 is grown (epitaxially grown) on the ultrathin SOI layer substrate having the hydrogen terminated surface.

Figure 10A:
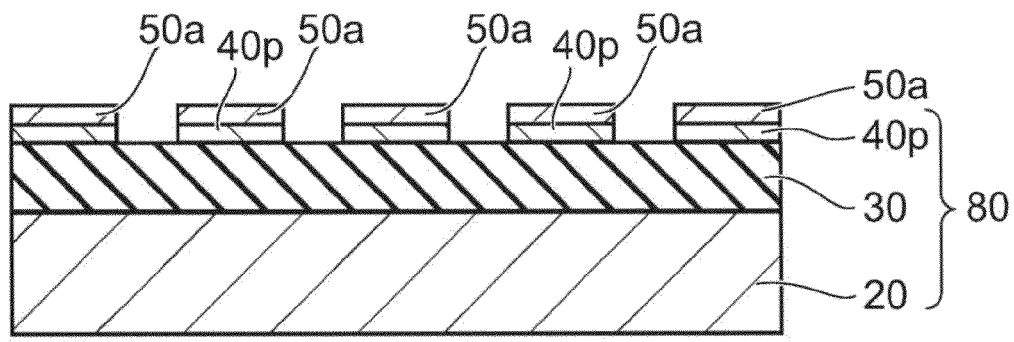
FIGS. 10A to 10C are schematic cross-sectional views illustrating the method for manufacturing a nitride semiconductor crystal layer according to the third embodiment.

For example, as illustrated in FIG. 10A, the nitride semiconductor crystal layer 50a (gallium nitride crystal layer), having a thickness of 30 nm, is formed on the ultrathin silicon parts 40p by introducing the sample substrate into a Metal Organic Chemical Vapor Deposition (MOCVD) apparatus, raising the substrate temperature to 500° C., and using TMG (trimethylgallium) and $NH_3$ (ammonia) as source materials.

Figure 10B:
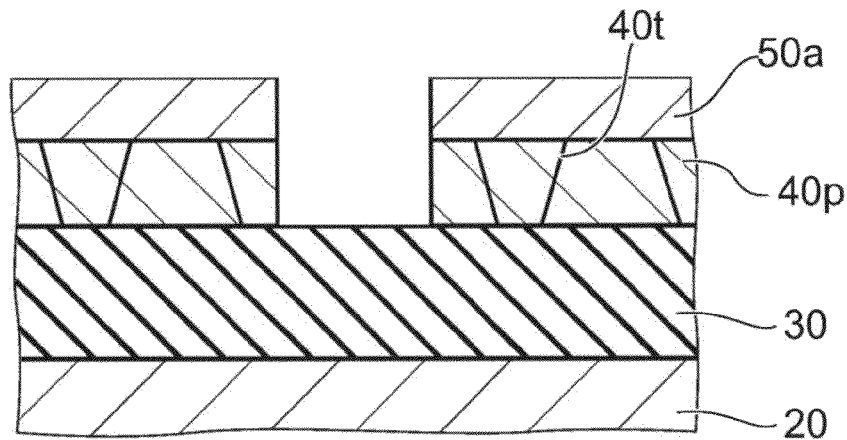

Next, as illustrated in FIG. 10B, the temperature of the substrate 80 is raised to 1080° C. At this time, a plastic deformation occurs by the introducing of the dislocation 40t on the ultrathin silicon parts 40p side due to the stress caused by the lattice mismatching between the nitride semiconductor crystal layer 50a and the ultrathin silicon parts 40p. Additionally, the strain that was applied to the nitride semiconductor crystal layer 50a is released due to the plastic deformation of the ultrathin silicon parts 40p.

Figure 10C:
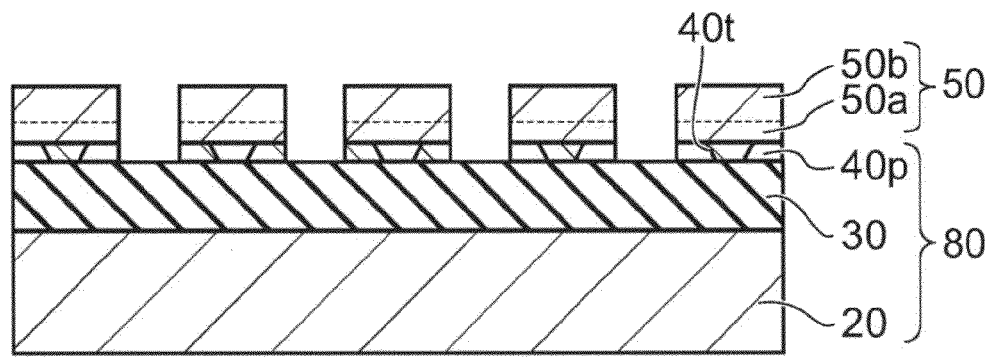

As illustrated in FIG. 10C, next, a nitride semiconductor crystal layer 50b (gallium nitride crystal layer) having a thickness of 2 μm is formed at 1080° C. using TMG (trimethylgallium) and $NH_3$ (ammonia) as source materials.

As in this embodiment, with the substrate 80 in which the island-like ultrathin silicon parts 40p are formed on the intermediate layer 30 that is a buried oxide film, growth of the nitride semiconductor crystal layer 50 occurs only selectively on the area where the silicon layer exists, and growth does not occur on the area where the intermediate layer 30 that is a buried oxide layer is exposed.

Furthermore, at this stage, a portion or all of the silicon atoms constituting the ultrathin silicon crystal layer 40 react with the nitride semiconductor crystal layer 50, interdiffusion of the gallium atoms and the silicon atoms occurs, and the silicon atoms are incorporated into the nitride semiconductor crystal. As a result, compared to before the growth of the nitride semiconductor crystal layer 50, the film thickness of the ultrathin silicon crystal layer 40 is further reduced, or the ultrathin silicon crystal layer 40 disappears.

Additionally, even if a partial strain remains in the nitride semiconductor crystal layer 50a after the low temperature growth and the raising of the temperature, the nitride semiconductor crystal layer 50 having complete lattice relaxation would be obtained at the stage when the nitride semiconductor crystal layer 50b, having a thickness of 2 μm, is grown at a high temperature, as same as when the island-like shapes are not formed.

Thus, in this embodiment, by processing the ultrathin silicon crystal layer 40 formed on the $SiO_2$ layer into island-like shapes in sections approximately not less than 500 μm and not more than 1000 μm and arranging the island-like shapes with spacing of not less than 0.1 μm and not more than 100 μm, the nitride semiconductor crystal layer 50 epitaxially grown thereon is formed selectively on only the tops of the portions of the ultrathin silicon parts 40p with leaving space mutually. Therefore, it is possible to avoid stress generated by the contracting of the nitride semiconductor crystal layer caused by the large thermal expansion coefficient and to suppress cracking.

Especially, in the selective growth of the nitride semiconductor crystal layer on the ultrathin silicon layer that has been processed into island-like shapes as in this embodiment, the effects of the stress caused by the difference in the thermal expansion coefficients when cooling, after the growth of the nitride semiconductor crystal layer at a high temperature, can be suppressed.

Specifically, because the thermal expansion coefficients of the three materials gallium nitride, $SiO_2$, and silicon differ, there is a difference in the amount of contraction when cooling. However, the $SiO_2$ layer that has a small thermal expansion coefficient and a small amount of contraction is interposed between the silicon that has a large thermal expansion coefficient and a relatively large amount of contraction, and the gallium nitride that has an even larger thermal expansion coefficient and an even larger amount of contraction; and furthermore, the gallium nitride layer is selectively formed into island-like shapes. Therefore, it is possible to balance the generated stress. Thereby, warping and cracking can be suppressed.

On the other hand, it is known that when the gallium nitride is stacked directly on the silicon substrate, stress is applied between both constituents and cracking occurs due to the difference in the thermal expansion coefficients of the gallium nitride and the silicon. In such a two-layer construction, the effect of dispersing stress caused by the island-like shape processing is limited because, even when a patterned oxide layer is formed on a silicon surface and a gallium nitride layer is selectively formed, the gallium nitride layer and the silicon substrate layer are directly bonded.

Thus, in this embodiment, the ultrathin silicon crystal layer 40 formed on the $SiO_2$ layer is processed into island-like shapes in sections having a characteristic length of approximately not less than 500 μm (0.5 mm or more) and not more than 1000 μm. The ultrathin silicon parts 40p are illustrated as island-like shapes having a quadrangular planar shape, but the planar shape of the ultrathin silicon parts 40p is not limited to being quadrangular. The planar shape of the ultrathin silicon parts 40p includes polygonal shapes other than square (i.e. triangular and rectangular shapes other than quadrangular shapes), circular, and the like. In this embodiment, "characteristic length" is an indicator designating a size of an unspecified shape. "Characteristic length" refers to a diameter in a case where the planar shape is circular or near-circular, and refers to a length of one side of a polygonal shape in a case where the planar shape is polygonal.

By disposing the islands spaced not less than 0.1 μm and not more than 100 μm, the nitride semiconductor crystal layer 50 epitaxially grown thereon is formed selectively on only the tops of the portions of the ultrathin silicon crystal in mutually spaced island-like shapes. In other words, the divided silicon crystal layer 40 is used as a base material for the growth of the nitride semiconductor crystal. Therefore, it is possible to avoid stress generated by the contracting of the nitride semiconductor crystal layer caused by the large thermal expansion coefficient and suppress cracking.

The nitride semiconductor crystal layer 50a corresponds to a first portion of the nitride semiconductor crystal layer 50. The nitride semiconductor crystal layer 50b corresponds to a second portion of the nitride semiconductor crystal layer 50. The second portion is a portion formed on the first portion.

As previously described, in the embodiment, the orientation of the plane of the silicon crystal layer 40 is preferably (111) plane. Thereby, the forming of a nitride semiconductor crystal layer 50 (e.g., a GaN layer) having excellent crystallinity is facilitated. The embodiment includes cases in which the silicon crystal layer 40 has complete crystallinity and also cases in which the silicon crystal layer 40 includes a polycrystalline state that is highly oriented, the orientation thereof being arranged in the (111) direction.

After step S120 described above (where the thickness of the silicon crystal layer 40 is reduced so as to be less than a second thickness, which is the initial thickness), the thickness (a first thickness) of the nitride semiconductor crystal layer 50 increases so as to be greater than the thickness (the second thickness) of the silicon crystal layer 40.

The nitride semiconductor crystal layer 50 is formed on the silicon crystal layer 40 by a portion of the silicon crystal layer 40 being incorporated into the nitride semiconductor crystal layer 50, so that the thickness of the silicon crystal layer 40 is reduced to less than the second thickness. The thickness of the silicon crystal layer 40 may be reduced from the second thickness by incorporating an entirety of the silicon crystal layer 40 into the nitride semiconductor crystal layer 50.

Specifically, the nitride semiconductor crystal layer 50 is formed by at least a portion of the silicon crystal layer 40 being incorporated into the nitride semiconductor crystal layer 50, so that the thickness of the silicon crystal layer 40 is reduced from the second thickness.

Hereinafter, another example of the method for manufacturing a nitride semiconductor crystal layer according to the embodiment will be described. This manufacturing method is an example of the method described in reference to FIGS. 3A, 3B, 4A, and 4B. Therefore, these figures will be referred to in the following description as well.

As illustrated in FIG. 3A, a substrate 80 having a Silicon on Insulator (SOI) structure is also used as the substrate in this method.

Here as well, the thickness of the base body 20 is 650 μm. However, in this example, the thickness of the intermediate layer 30, which is the buried oxide film layer, is 460 nm. The thickness of the top ultrathin silicon crystal layer (the SOI layer) 40 is 8 nm. Thus, the thicknesses of each type of layers can be varied as desired. An orientation of a crystal plane of the surface SOI layer is the (111) plane.

The SOI substrate used in this example is fabricated using a Separation by Implanted Oxygen (SIMOX) process.

More specifically, a Si substrate having a surface crystal orientation of (111) is subjected to oxygen ion implantation under a condition known as "high-dose," and then is annealed at a high temperature of 1350° C. in an inert gas atmosphere containing approximately 0.5% oxygen. Thereby, the ion implanted oxygen bonds with Si atoms, and an oxide film (the buried oxide film) is formed therein. As a result, a structure is completed wherein an oxide film having a thickness of approximately 450 nm is formed in the Si substrate.

At this point, the thickness of the Si layer (SOI layer) of the surface side is approximately 150 nm. Following the high temperature annealing, which is performed after the oxygen ion implanting, high temperature annealing (thermal oxidation) is continued in an oxidative atmosphere wherein oxygen concentration has been increased 20% to 100%. Through this process, an oxide film having a thickness of approximately 200 nm is formed on the surface. Thereby, the thickness of the SOI layer is reduced to 50 nm.

At this time, the thickness of the buried oxide film increases slightly due to the effects of Internal Oxidation (ITOX). Thereafter, a hydrofluoric acid solution is used to remove the oxide film of the surface.

Here, the thickness of the ultrathin silicon crystal layer (the SOI layer) is greater than the desired thickness of the SOI layer. Therefore, the thickness of the silicon crystal layer (SOI layer) is reduced by oxidizing the surface layer approximately 93 nm through subjection to further thermal oxidization. Thus, the thickness of the SOI layer is reduced to 8 nm. Thereby, the silicon crystal layer (SOI layer) 40 having the desired thickness can be obtained. Thereafter, the oxide film layer of the surface is etched using the hydrofluoric acid solution again. Through this treatment, the silicon crystal layer (SOI layer) 40 becomes a surface structure terminated by hydrogen, and becomes a water-repellent surface.

Next, as illustrated in FIG. 3B, the nitride semiconductor crystal layer 50a (gallium nitride crystal layer) is thin film crystal grown (epitaxially grown) on the ultrathin SOI layer substrate having the hydrogen terminated surface. The substrate 80 that is the sample substrate is introduced into a MOCVD (Metal Organic Chemical Vapor Deposition) apparatus, a substrate temperature is raised to 520° C., and the nitride semiconductor crystal layer 50a, having a thickness of 70 nm, is formed using TMG (trimethylgallium) and $NH_3$ (ammonia) as source materials.

Figure 11:
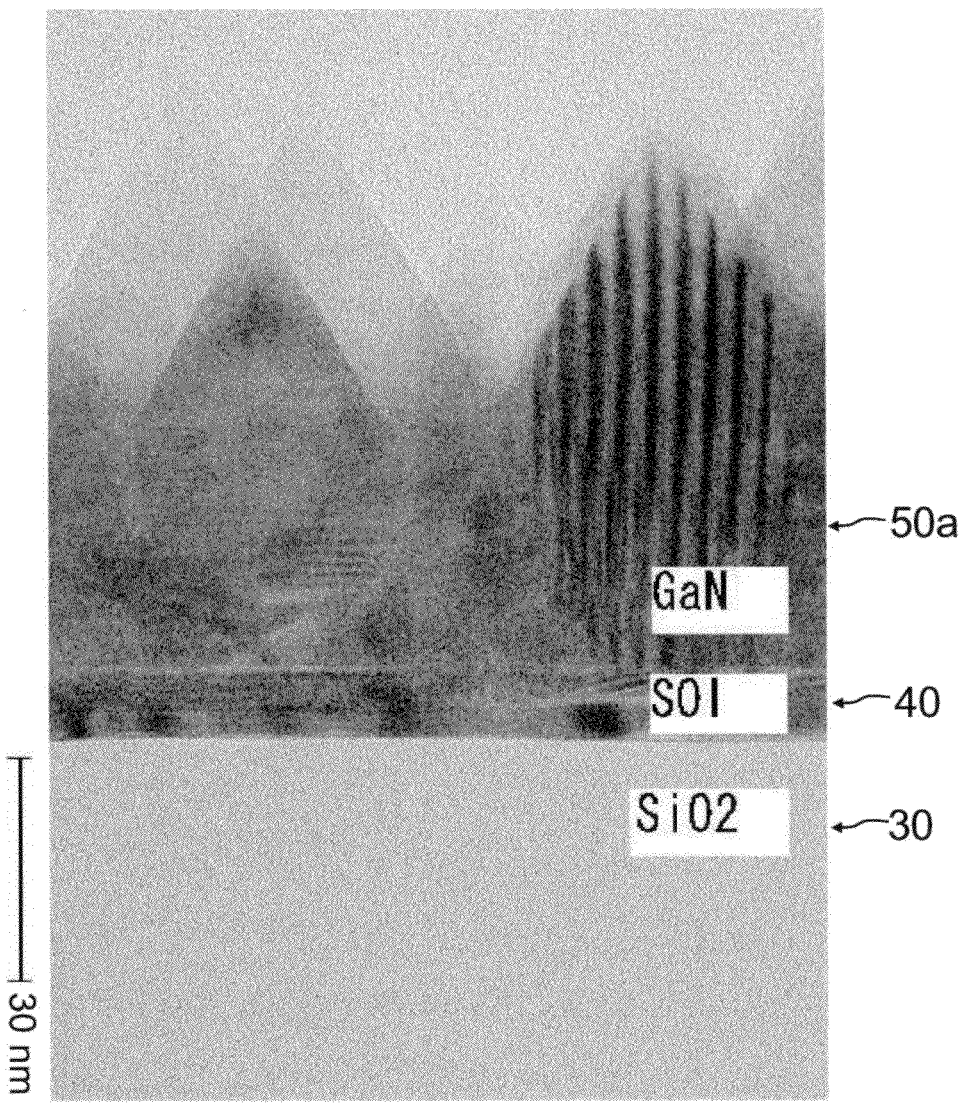
FIG. 11 is an electron microscope photograph illustrating a state of a crystal layer partway through the method for manufacturing a nitride semiconductor crystal layer according to the first embodiment.

FIG. 11 is an electron microscope photograph illustrating a state of the crystal layer partway through the method for manufacturing a nitride semiconductor crystal layer according to the first embodiment.

FIG. 11 shows the results of a cross-section of the crystal layer, as observed using an electron microscope, in a state where the nitride semiconductor crystal layer 50a has been formed.

As is clear from FIG. 11, the region of the SOI layer (the silicon crystal layer 40) is clearly observed between the $SiO_2$ layer (the intermediate layer 30) and the gallium nitride crystal layer (the nitride semiconductor crystal layer 50a). Thus, at this stage, the SOI layer and the GaN layer do not react, and boundaries of each layer can be clearly identified.

Additionally, as is clear from FIG. 11, the GaN layer (the nitride semiconductor crystal layer 50a) is formed so as to completely cover the SOI layer. This low-temperature formed GaN layer has poor flatness and, therefore, recesses and protrusions are formed in the surface.

Thereafter, as illustrated in FIG. 4A, the temperature of the substrate 80 is raised to 1120° C.

As illustrated in FIG. 4B, next, at 1120° C., a nitride semiconductor crystal layer 50b (gallium nitride crystal layer) having a thickness of 100 nm is formed using TMG (trimethylgallium) and NH$_3$ (ammonia) as source materials by epitaxial growth for five minutes.

Figure 12:
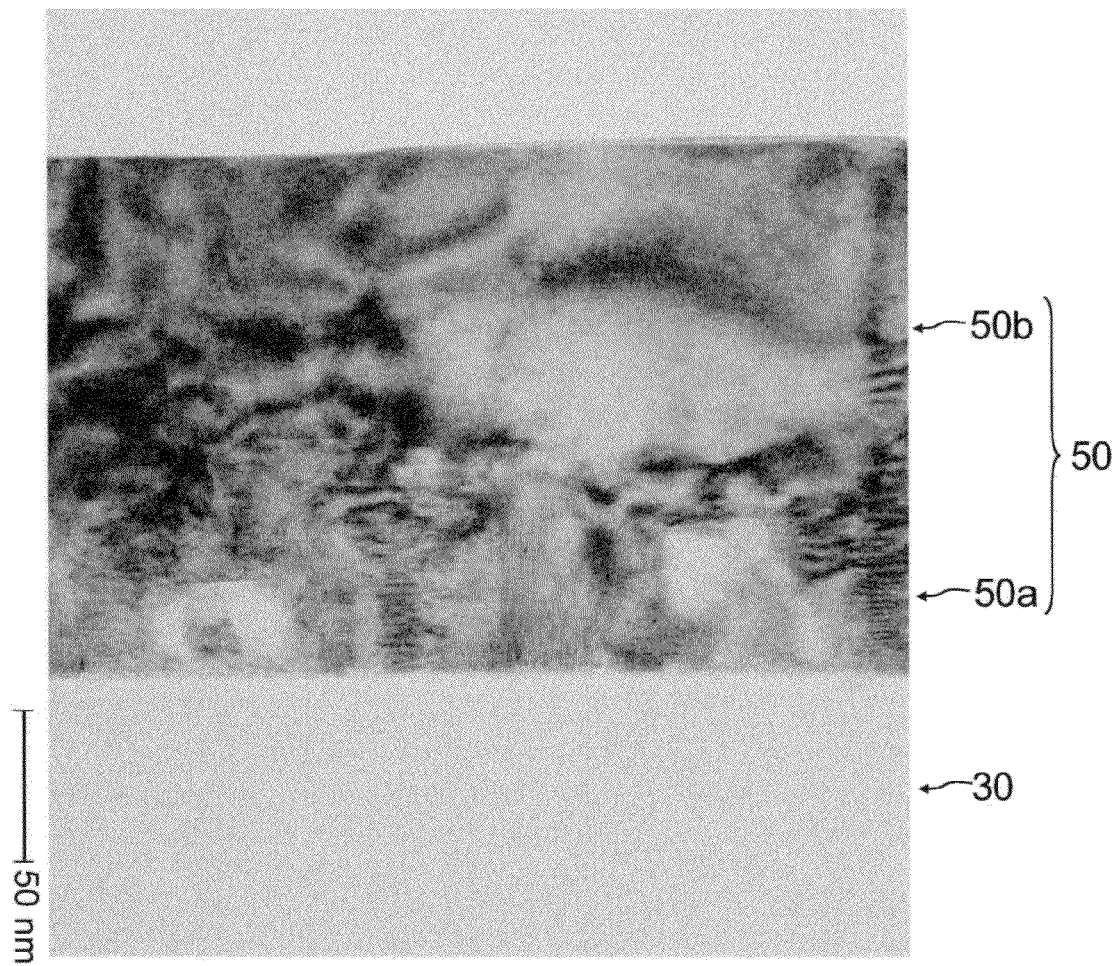
FIG. 12 is an electron microscope photograph illustrating a state of the crystal layer partway through the method for manufacturing a nitride semiconductor crystal layer according to the first embodiment.

FIG. 12 is an electron microscope photograph illustrating a state of the crystal layer partway through the method for manufacturing a nitride semiconductor crystal layer according to the first embodiment.

FIG. 12 shows the results of a cross-section of the crystal layer, as observed using an electron microscope, in a state where the nitride semiconductor crystal layer 50b has been formed.

As is clear from FIG. 12, along with the GaN layer (the nitride semiconductor crystal layer 50a) formed at a low temperature of 520° C., a GaN layer having a total thickness of approximately 170 nm is formed on the SiO$_2$ layer (the buried oxide film layer, the intermediate layer 30) with the flat surface. In other words, the surface that had recesses and protrusions after the low temperature growth is flattened by the high temperature growth process.

As is clear from FIG. 12, the SOI layer (the silicon crystal layer 40) that existed between the SiO$_2$ layer (the intermediate layer 30) and the GaN layer (the nitride semiconductor crystal layer 50a) cannot be clearly observed.

Figure 13:
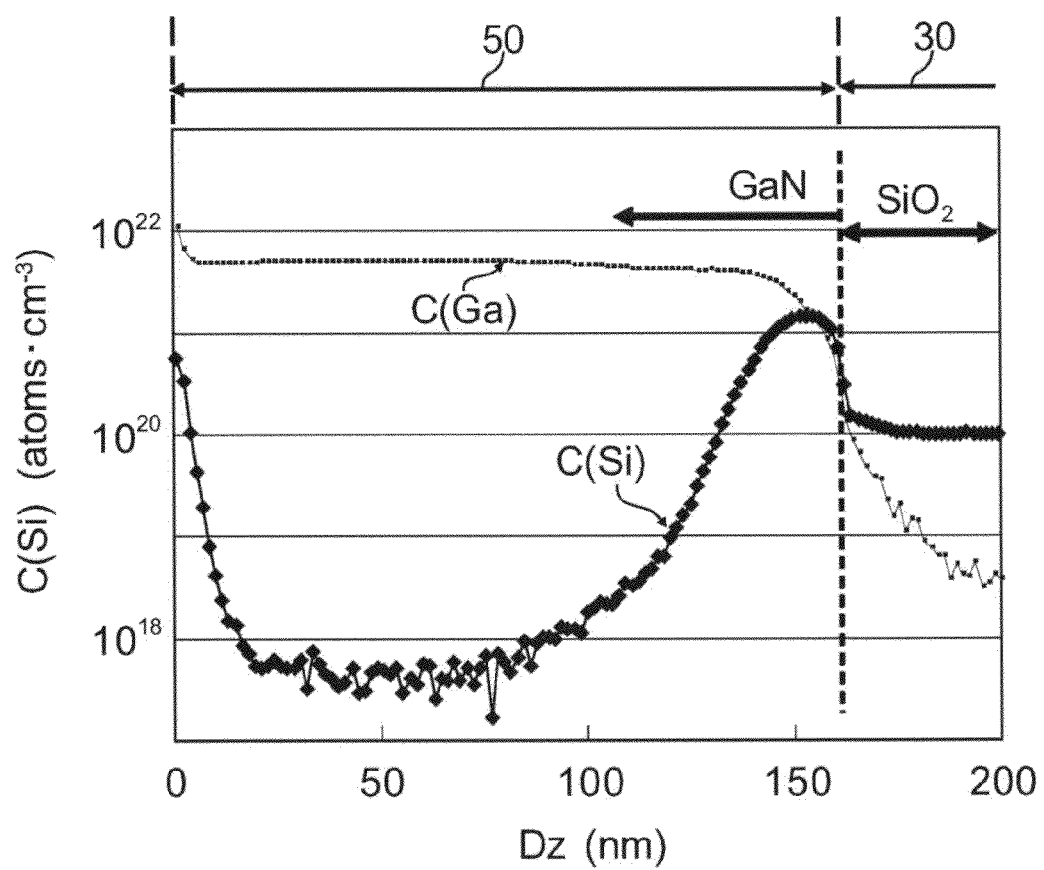
FIG. 13 is a graph illustrating a state of the crystal layer partway through the method for manufacturing a nitride semiconductor crystal layer according to the first embodiment.

FIG. 13 is a graph illustrating a state of the crystal layer partway through the method for manufacturing a nitride semiconductor crystal layer according to the first embodiment.

Specifically, FIG. 13 shows an example of results of measuring the concentration profile of the Si element and the concentration profile of the Ga element in the SiO$_2$ layer and the GaN layer in the state illustrated in FIG. 12. The SiO$_2$ layer corresponds to the intermediate layer 30. The GaN layer corresponds to the nitride semiconductor crystal layer 50 (nitride semiconductor crystal layers 50a and 50b). The concentration of the Si element was measured using Secondary Ion Mass Spectrometry (SIMS). In FIG. 13, a depth Dz in the measurement is shown on the horizontal axis. The depth Dz is a depth from the surface of the nitride semiconductor crystal layer 50 along a direction from the nitride semiconductor crystal layer 50 toward the intermediate layer 30. The concentration C (Si) of the Si element is shown on the vertical axis. In FIG. 13, for the concentration of the Ga element, the characteristics of the secondary ion intensity as obtained is displayed As illustrated in FIG. 13, the concentration C (Ga) of the Ga element is high in the GaN layer and low in the SiO$_2$ layer.

Furthermore, as is clear from FIG. 13, the concentration C (Si) of the Si element in the GaN layer is approximately $1\times10^{21}$ (atoms·cm$^{-3}$) in the vicinity of the interface between the GaN layer and the SiO$_2$ layer. At locations separated from the interface, the concentration C (Si) of the Si element in the GaN layer decreases to approximately $1\times10^{18}$ (atoms·cm$^{-3}$).

As described previously, in the method for manufacturing a nitride semiconductor crystal layer according to this embodiment, the thickness of the silicon crystal layer 40 is reduced by a portion or an entirety of the silicon crystal layer 40 being incorporated in the nitride semiconductor crystal layer 50. In this configuration, silicon atoms originating in the silicon crystal layer 40 migrate from the interface of the intermediate layer 30 side of the nitride semiconductor crystal layer 50 to the nitride semiconductor crystal layer 50.

Therefore, as described above, the concentration C (Si) of the Si element in a first region on the SiO$_2$ layer (the intermediate layer 30) side of the GaN layer is high. Also, the concentration C (Si) of the Si element in a second region of the GaN layer that is farther from the SiO$_2$ layer (the intermediate layer 30) than the first region is lower than the concentration C (Si) of the Si element in the first region.

Specifically, the concentration of silicon in the first region on the substrate 20 side of the nitride semiconductor crystal layer 50 is higher than the concentration of silicon in the second region that is farther from the substrate 20 in the nitride semiconductor crystal layer 50 than the first region is.

In other words, the concentration C (Si) of the Si element is diffused as described above, and this unique configuration in which the concentration is extremely high at approximately $1\times10^{21}$ (atoms·cm$^{-3}$) in the vicinity of the interface between the GaN layer and the SiO$_2$ layer, is made achieved by the specific configuration of the embodiment (the configuration in which a portion or an entirety of the silicon crystal layer 40 is incorporated into the nitride semiconductor crystal layer 50).

In the embodiment, a nitride semiconductor crystal layer that is thicker than the nitride semiconductor crystal layer 50b (thickness of 100 nm) described above can be formed on the low-temperature formed nitride semiconductor crystal layer 50a. For example, after forming the nitride semiconductor crystal layer 50a described above, a GaN layer having a thickness of approximately 2.4 μm was formed at 1120° C. by setting an epitaxial growth time of the GaN layer as 60 minutes. This GaN layer is a crystal layer corresponding to, for example, the semiconductor stacked body 150, 250, or the like (or a portion thereof) described above.

Figure 14:
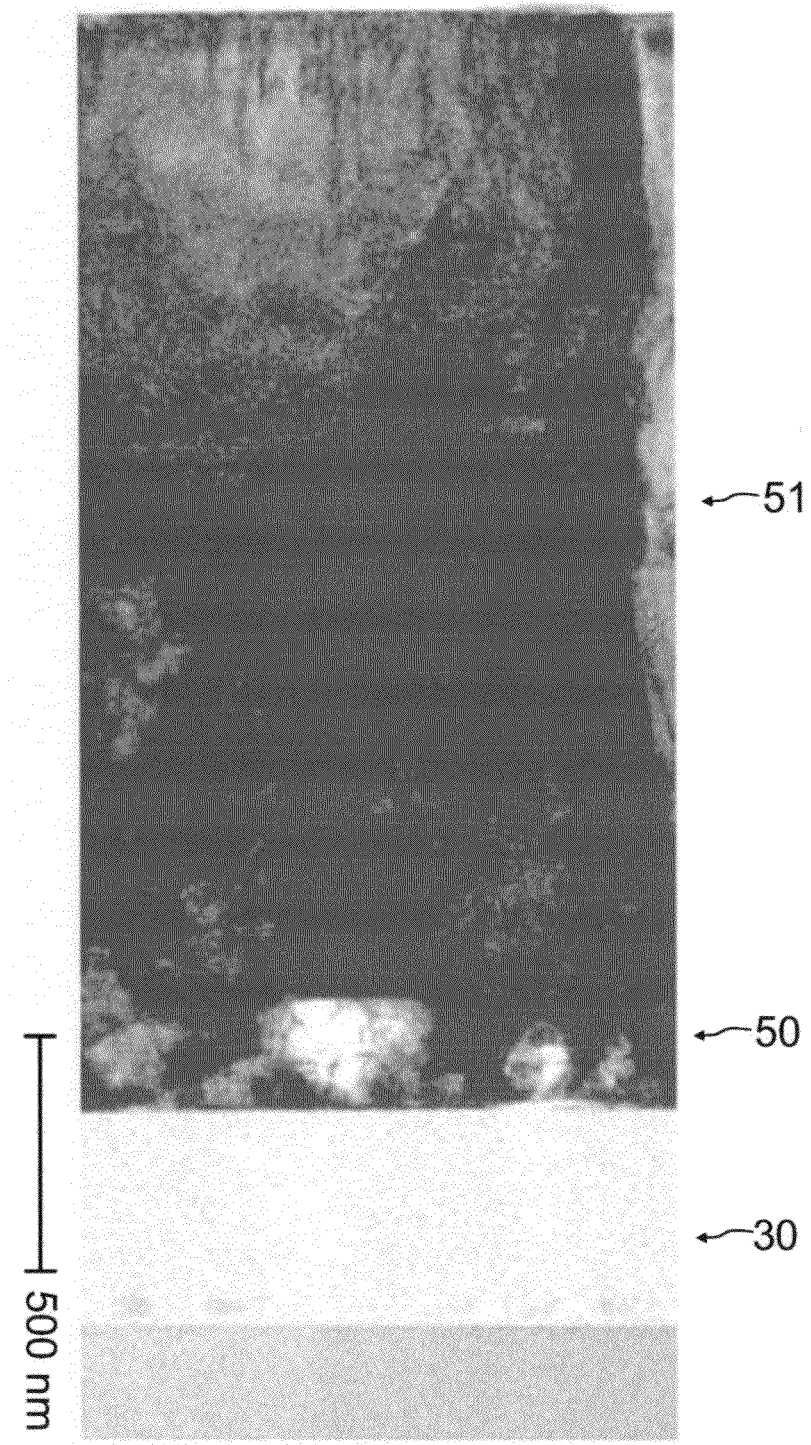
FIG. 14 is an electron microscope photograph illustrating a state of the crystal layer of the method for manufacturing a nitride semiconductor crystal layer according to the first embodiment.

FIG. 14 is an electron microscope photograph illustrating a state of the crystal layer of the method for manufacturing a nitride semiconductor crystal layer according to the first embodiment.

FIG. 14 shows an image, observed using an electron microscope, of a cross-sectional view of the crystal layer in a state where the GaN layer (a crystal layer 51) having a thickness of approximately 2.4 μm is formed as described above.

As is clear from FIG. 14, the surface of the crystal layer 51 (the GaN layer having a thickness of approximately 2.4 μm) is flat. Thus, with the manufacturing method according to the embodiment, a flat GaN layer can be obtained.

Hereinafter, results of evaluations of the characteristics of a sample (sample S1) in this state and a sample of a reference example (sample S2) will be described. The sample S2 of the reference example is a sample obtained by a growth of a GaN layer on a bulk silicon substrate at a low temperature (520° C.) followed by growth of a GaN layer having a thickness of approximately 2 μm thereon at a high temperature (1120° C.). In other words, the sample S2 of the reference example corresponds to a sample that does not include the intermediate layer 30 and the silicon crystal layer 40 of the manufacturing method according to the embodiment.

Figure 15:
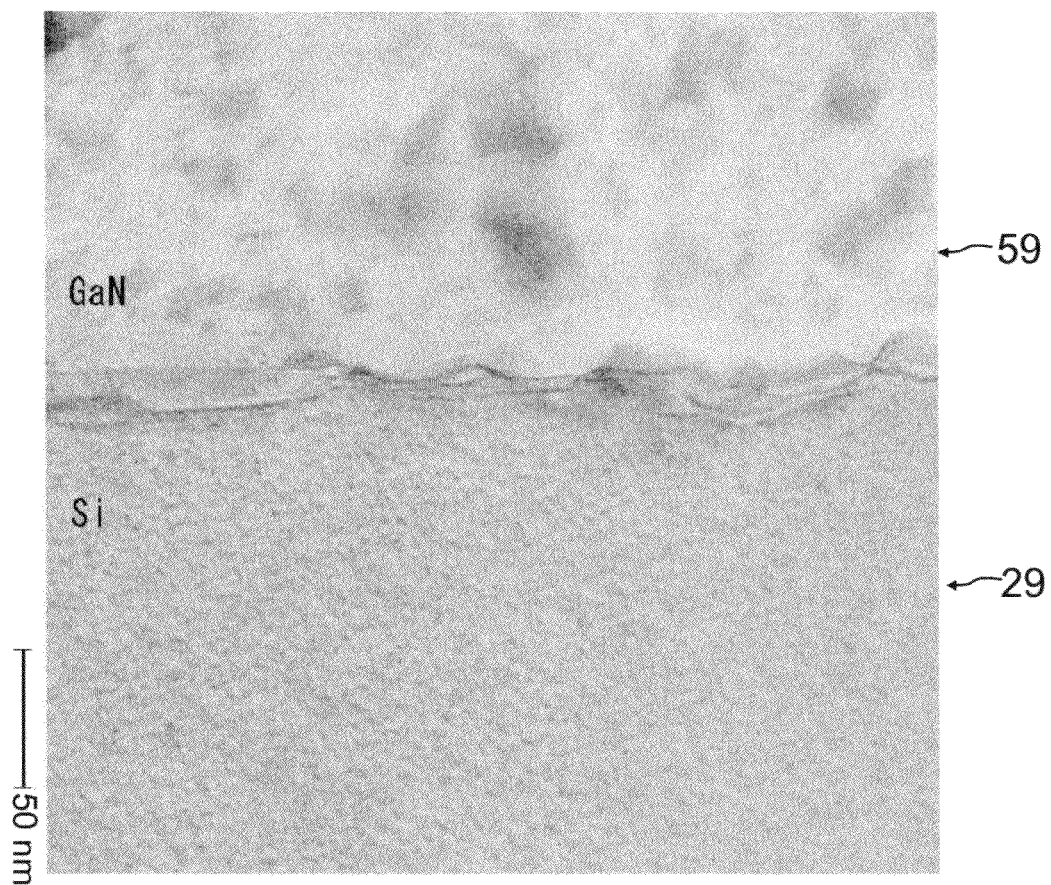
FIG. 15 is an electron microscope photograph illustrating a state of a crystal layer of a method for manufacturing a nitride semiconductor crystal layer of a reference example.

FIG. 15 is an electron microscope photograph illustrating a state of a crystal layer of the method for manufacturing a nitride semiconductor crystal layer of the reference example.

FIG. 15 is an electron microscope photograph of a cross-sectional view of the vicinity of a GaN/Si interface (interface between a nitride semiconductor crystal layer 59 and a bulk silicon substrate 29) of the sample S2 of the reference example. As is clear from FIG. 15, a portion where a reaction occurred at the interface between the bulk silicon substrate 29 and the nitride semiconductor crystal layer 59 is observed.

Distribution of the Si element and the Ga element in the sample S1 according to the embodiment and the sample S2 of the reference example was evaluated using EDX analysis.

FIGS. 16A to 16D are images showing analysis results that illustrate the characteristics of the nitride semiconductor crystal layer.

FIGS. 16A and 16B correspond to the sample S1. FIGS. 16C and 16D correspond to the sample S2. FIGS. 16A and 16C express the concentration of the Si element. In these figures, light portions (portions of the figure where brightness is low) represent a higher concentration of the Si element compared to dark portions (portions of the figure where brightness is high). FIGS. 16B and 16D express the concentration of the Ga element. In these figures, light portions represent a higher concentration of the Ga element compared to dark portions.

As illustrated in FIG. 16C, in the sample S2 of the reference example, light portions (portions where the concentration of the Si element is high) are observed throughout a broad region in the GaN layer (the nitride semiconductor crystal layer 59). As illustrated in FIG. 16D, there are variations in the brightness of the image in the GaN layer (the nitride semiconductor crystal layer 59), indicating that the concentration of the Ga element is nonuniform. It is clear that the Si element is diffused throughout a broad region in the GaN layer (the nitride semiconductor crystal layer 59) in the sample S2 of the reference example. It is estimated that the concentration of the Si element in the GaN layer is 30%. Specifically, not only is the Si element mixed into the GaN crystal, but it is also assumed that the GaN crystal is mixed with Si, the SiN layer, and the like.

As illustrated in FIGS. 16A and 16B, in the sample S1 according to the embodiment, the light region of the image and the dark region of the image are clearly defined. The concentration of the Si element in the center portion of the GaN layer is below detection limit by EDX analysis. This concentration is, for example, estimated to be, 1% or less.

Figure 17A:
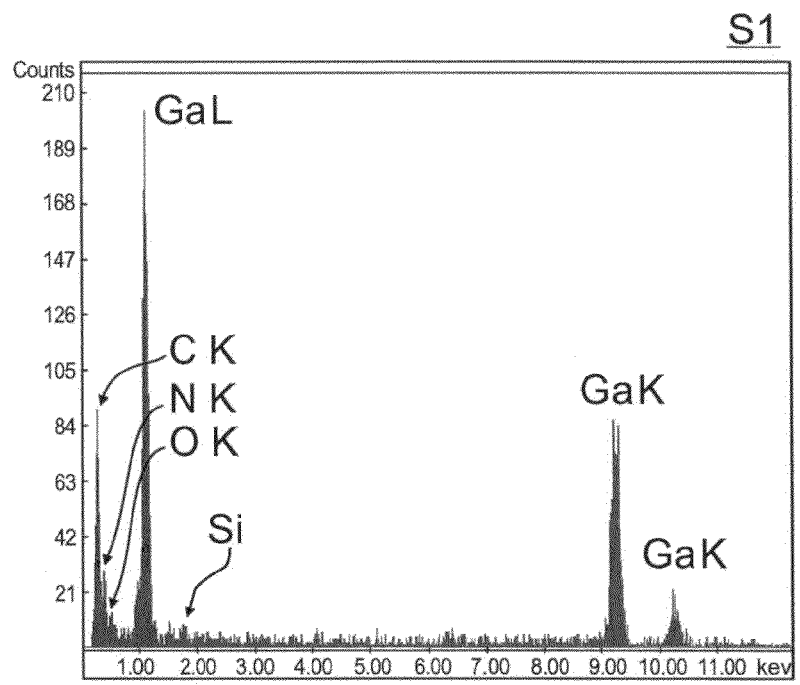
FIGS. 17A and 17B are diagrams illustrating analysis results of the crystal layer of the method for manufacturing a nitride semiconductor crystal layer according to the first embodiment.
Figure 17B:
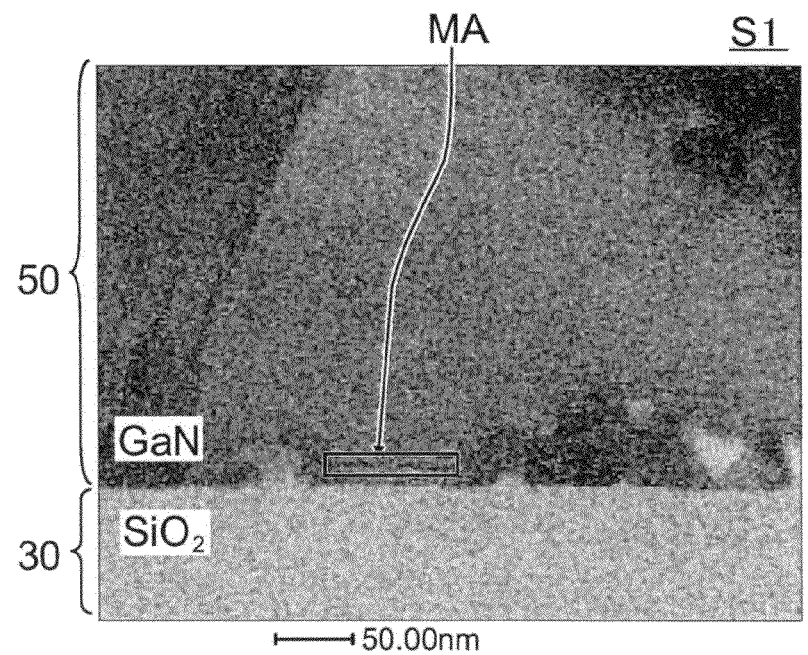

FIGS. 17A and 17B show analysis results of the crystal layer formed by the method for manufacturing a nitride semiconductor crystal layer according to the first embodiment.

FIG. 17A shows an EDX spectrum of the sample S1. FIG. 17B indicates a measured area MA subjected to EDX analysis in the sample S1. In FIG. 17A, a peak GaK and a peak GaL correspond to signals from a K shell and an L shell of the Ga element, respectively. As indicated in FIG. 17B, in this measurement, a position in the GaN layer relatively close to the $SiO_2$ layer is evaluated.

As is clear from FIG. 17A, in the sample S1, the concentration of the Si element in the GaN layer is low, and it is estimated that the concentration is 1% or less, which is the detection limit of this measurement.

Figure 18A:
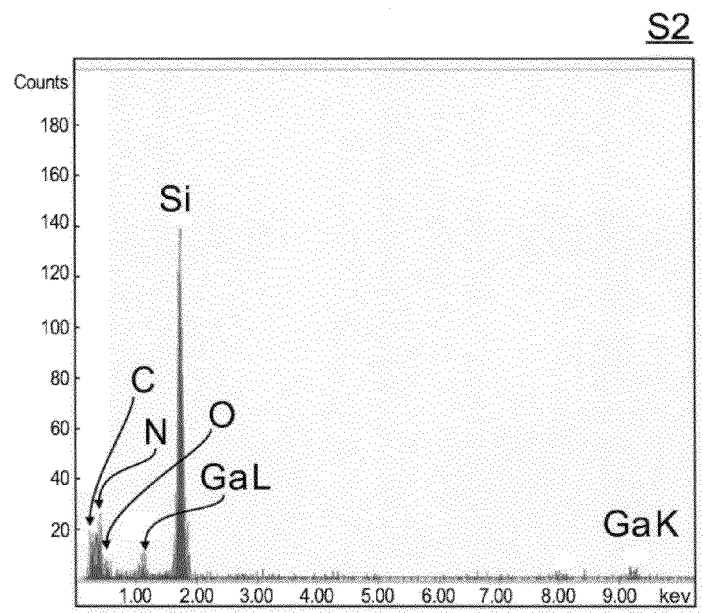
FIGS. 18A and 18B are diagrams illustrating analysis results of the crystal layer of the reference example.
Figure 18B:
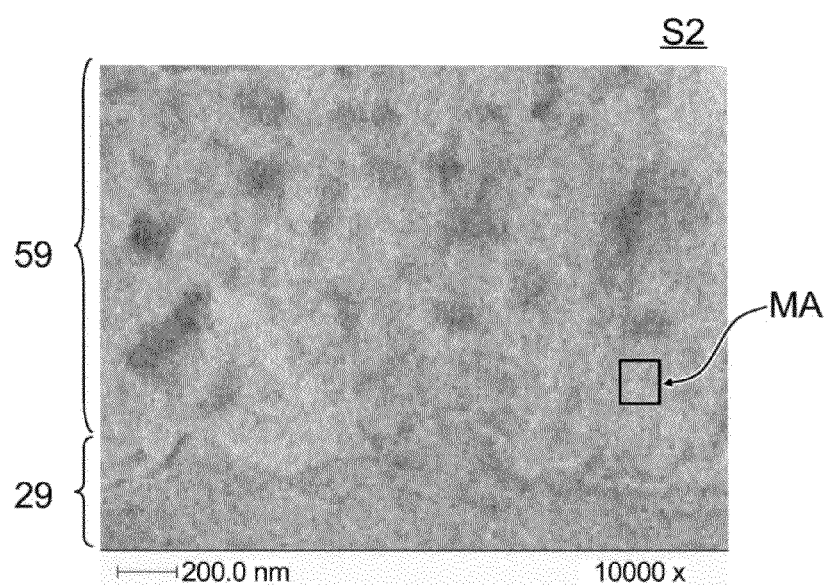

FIGS. 18A and 18B show analysis results illustrating the characteristics of the crystal layer of the reference example.

FIG. 18A shows an EDX spectrum of the sample S2. FIG. 18B indicates a position subjected to EDX analysis in the sample S2.

As is clear from FIG. 18A, in the sample S2, the concentration of the Si element in the GaN layer (nitride semiconductor crystal layer 59) is also high. Thus, in the sample S2, the amount of the Si element diffused in the GaN layer is extremely high.

In the case where the GaN crystal layer is directly stacked on the bulk silicon substrate 29 as described above, the Ga metal in the GaN decomposed from the nitrogen element at the interface, and a Ga—Si reaction occurs. Therefore, the Si crystal portion is corroded, and, furthermore, due to this reaction, a large amount of the Si element is diffused into the GaN layer side. This leads to a severe deterioration in the quality of the GaN crystal.

On the other hand, in the case where the nitride semiconductor crystal layer is stacked on the bulk silicon substrate, a configuration in which aluminum nitride is inserted into the interface is proposed. However, in this configuration, extra dislocations and the like from the aluminum nitride are easily generated.

In contrast, as previously described, in the manufacturing method according to the embodiment, the GaN layer is stacked on the ultrathin silicon crystal layer 40. In this configuration, the reaction between Si and the GaN crystal is limited. Therefore, the diffusion of the Si element into the GaN layer is also limited. Thus, a GaN crystal layer of excellent quality is obtained.

Thus, the characteristics obtained through the specific configuration according to the embodiment can be confirmed via the experimental data described in relation to FIGS. 11 to 18A and 18B.

A method for manufacturing a nitride semiconductor crystal layer of higher quality is provided according to the embodiment.

In this specification, the term, "nitride semiconductor" includes semiconductors of all compositions wherein composition ratios of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, with the formula described above, "nitride semiconductors" shall also be understood to include semiconductors further including group V elements other than N (nitrogen), and semiconductors further including various dopants added to control various physical properties such as conductivity type and the like.

Hereinabove, embodiments of the invention are described with reference to examples. However, the invention is not limited to these examples. In other words, various modifications made by one skilled in the art to the examples recited above are included in the scope of the invention to the extent that the purport of the invention is included. For example, components and the arrangements, materials, conditions, configurations, sizes, etc., of the components included in the examples described above are not limited to these exemplifications; and can be modified appropriately.

Further, components included in the embodiments described above may be combined within the extent of technical feasibility; and are included in the scope of the invention to the extent that the purport of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a nitride semiconductor crystal layer, comprising:
forming the nitride semiconductor crystal layer having a first thickness not less than 1 micrometer on a silicon crystal layer having a second thickness not more than 50 nanometers, the silicon crystal layer being provided on a base body,
the silicon crystal layer having said second thickness before the forming the nitride semiconductor crystal layer, fully interdiffusing the silicon crystal layer into the nitride semiconductor crystal layer during forming of the nitride semiconductor crystal layer to cause disappearance of the silicon crystal layer.

2. The method according to claim 1, wherein
the base body includes a substrate,
the forming the nitride semiconductor crystal layer further includes:
forming a structure including
the substrate, and
the nitride semiconductor crystal layer provided on the substrate, and silicon included in the silicon crystal layer is introduced in the nitride semiconductor crystal layer.

3. The method according to claim 2, wherein the base body has a crystal profile which differs from a crystal profile of the silicon crystal layer.

4. A method for manufacturing a nitride semiconductor crystal layer comprising:
forming the nitride semiconductor crystal layer having a first thickness on a silicon crystal layer, the silicon crystal layer being provided on a base body,
the silicon crystal layer having a second thickness before the forming the nitride semiconductor crystal layer, the second thickness being thinner than the first thickness,
the forming the nitride semiconductor crystal layer including making the silicon crystal layer incorporated into the nitride semiconductor crystal layer to reduce a thickness of the silicon crystal layer from the second thickness and to cause disappearance of the silicon crystal layer,
the base body including a substrate,
the forming the nitride semiconductor crystal layer further including:
forming a structure including
the substrate, and
the nitride semiconductor crystal layer provided on the substrate, and silicon included in the silicon crystal layer being introduced in the nitride semiconductor crystal layer,
wherein a melt back etching of the silicon crystal layer by a group III element is limited by the second thickness.

5. The method according to claim 1, wherein
the base body includes
a substrate, and
an intermediate layer formed on the substrate,
the forming the nitride semiconductor crystal layer further includes:
forming a structure including
the substrate,
the intermediate layer formed on the substrate, and
the nitride semiconductor crystal layer provided on the intermediate layer, and silicon included in the silicon crystal layer is introduced in the nitride semiconductor crystal layer.

6. The method according to claim 5, wherein the base body has a crystal profile which differs from a crystal profile of the silicon crystal layer.

7. A method for manufacturing a nitride semiconductor crystal layer comprising:
forming the nitride semiconductor crystal layer having a first thickness on a silicon crystal layer, the silicon crystal layer being provided on a base body,
the silicon crystal layer having a second thickness before the forming the nitride semiconductor crystal layer, the second thickness being thinner than the first thickness,
the forming the nitride semiconductor crystal layer including making the silicon crystal layer incorporated into the nitride semiconductor crystal layer to reduce a thickness of the silicon crystal layer from the second thickness and to cause disappearance of the silicon crystal layer,
the base body including
a substrate, and
an intermediate layer formed on the substrate,
the forming the nitride semiconductor crystal layer further including:
forming a structure including
the substrate,
the intermediate layer formed on the substrate, and
the nitride semiconductor crystal layer provided on the intermediate layer, and
silicon included in the silicon crystal layer being introduced in the nitride semiconductor crystal layer,
wherein a melt back etching of the silicon crystal layer by a group III element is limited by the second thickness.

8. The method according to claim 5, wherein the substrate is a silicon substrate.

9. The method according to claim 5, wherein the substrate includes a silicon polycrystal.

10. The method according to claim 5, wherein the substrate includes a silicon single crystal.

11. The method according to claim 5, wherein the intermediate layer is a silicon oxide film.

12. The method according to claim 1, wherein the second thickness is not more than 20 nanometers.

13. The method according to claim 1, wherein an orientation of a crystal plane of the silicon crystal layer is a (111) plane.

14. The method according to claim 1, wherein the forming the nitride semiconductor crystal layer includes:
forming a first portion of the nitride semiconductor crystal layer on the silicon crystal layer at a first temperature, and
forming a second portion of the nitride semiconductor crystal layer on the first portion at a second temperature, the second temperature being higher than the first temperature.

15. The method according to claim 14, wherein a thickness of the first portion is thinner than a thickness of the second portion.

16. The method according to claim 1, wherein
the silicon crystal layer has a surface which is terminated by hydrogen, and
the nitride semiconductor crystal layer is formed on the surface terminated by hydrogen.

17. The method according to claim 1, wherein
the silicon crystal layer is divided into island-like shapes having a characteristic length of not less than 0.5 mm and not more than 10 mm in a plane parallel to a layer face of the silicon crystal layer, and
the forming the nitride semiconductor crystal layer includes forming the nitride semiconductor crystal layer on the divided silicon crystal layer.

18. The method according to claim 1, wherein a concentration of silicon of the nitride semiconductor crystal layer in a first region on a side of the base body is higher than a concentration of silicon of the nitride semiconductor crystal layer in a second region, the second region being farther from the base body than the first region.

* * * * *